United States Patent

Kawahara et al.

[11] Patent Number: 5,834,060
[45] Date of Patent: *Nov. 10, 1998

[54] HIGH DIELECTRIC CONSTANT THIN FILM STRUCTURE METHOD FOR FORMING HIGH DIELECTRIC CONSTANT THIN FILM AND APPARATUS FOR FORMING HIGH DIELECTRIC CONTACT THIN FILM

[75] Inventors: Takaaki Kawahara; Mikio Yamamuka; Tetsuro Makita; Tsuyoshi Horikawa; Akimasa Yuuki; Teruo Shibano, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 720,751

[22] Filed: Oct. 1, 1996

[30] Foreign Application Priority Data

Feb. 13, 1996 [JP] Japan .................................. 8-025245

[51] Int. Cl.$^6$ .................................................. C23C 16/40
[52] U.S. Cl. ...................................... 427/255.3; 427/255.7
[58] Field of Search .................. 427/79, 255.2, 427/255.3, 126.3, 255.7

[56] References Cited

U.S. PATENT DOCUMENTS

| | | | |
|---|---|---|---|
| 4,775,203 | 10/1988 | Vakil et al. | 350/1.7 |
| 5,372,850 | 12/1994 | Uchikawa et al. | 427/255.3 |
| 5,406,445 | 4/1995 | Fujii et al. | 361/305 |
| 5,527,567 | 6/1996 | Desu et al. | 427/573 |
| 5,618,761 | 4/1997 | Eguchi et al. | 438/785 |

FOREIGN PATENT DOCUMENTS 7-268634   10/1995   Japan .

Primary Examiner—Shrive Beck
Assistant Examiner—Timothy Meeks
Attorney, Agent, or Firm—Sughrue, Mion, Zinn, Macpeak & Seas, PLLC

[57] ABSTRACT

There is provided a (Ba, Sr) TiO$_3$ film of higher dielectric constant and less leakage current for serving as a dielectric thin film of a capacitor in a semiconductor memory. DPM (dipivaloylmethanato) compounds of Ba, Sr and Ti are dissolved in THF (tetrahydrofuran) to obtain Ba(DPM)$_2$/THF, Sr(DPM)$_2$/THF and TiO(DPM)$_2$/THF solutions which are used as source material solutions. A (Ba, Sr) TiO$_3$ film is formed by a CVD method while increasing a relative percentage of a Ti source material flow rate to a sum of Ba source material flow rate and Sr source material flow rate. The film formation is carried out in multiple steps, and annealing is applied in each step after deposition of the film.

3 Claims, 22 Drawing Sheets

HIGH DIELECTRIC CONSTANT THIN FILM STRUCTURE METHOD FOR FORMING HIGH DIELECTRIC CONSTANT THIN FILM AND APPARATUS FOR FORMING HIGH DIELECTRIC CONTACT THIN FILM

BACKGROUND OF THE INVENTION

1. Field of the Invention

The present invention relates to a method for forming film, a film forming apparatus, and a thin film structure for use in the Chemical Vapor Deposition (CVD) method used in the process of forming a thin film with a high dielectric constant, such as is required in a semiconductor memory.

2. Description of the Related Art

In recent years, rapid progress has been made in the integration of semiconductor memories or devices and, particularly, with respect to dynamic random access memories (DRAMs). In DRAMs, for example, the progress in integration has been so rapid that the number of bits has quadrupled in only three years, even against the background of the increasing needs of the highly integrated device (e.g., reduced power consumption and cost).

No matter how much integration may be improved, however, it remains true that the capacitor forming a memory cell of a DRAM must have a sufficient capacity. To produce such a capacitor, it is necessary to make a thin film of capacitor material. There exists, however, a current limit as to the minimum thinness achievable with a capacitor material film, such as $SiO_2$.

A sufficient capacity may also be secured, in the same manner as thinning the film, by increasing the dielectric constant of the capacitor material through variation of the material itself. In view of the limit on thinness, and with an eye toward increasing the dielectric constant of the capacitor material, research and development into utilizing a material with a high dielectric constant in a memory device has been increasingly popular in this technical field.

In terms of the performance required of such a capacitor material, what is most important is that a film be thin and have a high dielectric constant, as mentioned above, and that the leakage current be small. That is, in employing any material with a high dielectric constant, the material must be made as thin as possible, and the leakage current therefrom must be minimized. It is generally desired, as a rough development target, that the film thickness be 0.6 nm or less, as calculated in terms of $SiO_2$, and that the leak current density be $2 \times 10^{-7}$ $A/cm^2$ or less when IV is applied.

In forming a thin film on an electrode for a stepped DRAM capacitor, a CVD method suitable for deposition on an object of such a complicated shape is most advantageous. A serious problem, however, has hitherto existed in that there is no known material which has a stable and desirable vaporization characteristic which can be used as source material for CVD. This is mainly because the vaporization characteristic from heating a dipivaloylmethanato (DPM) compound of β-diketone (popularly used as a CVD source material) is not always satisfactory.

In view of the foregoing circumstances, the inventors already have proposed a CVD source material for which the vaporization characteristic is remarkably improved. This improvement is accomplished by dissolving conventional solid source materials in an organic solvent called THF (Tetrahydrofuran: $C_4H_8O$) to obtain a solution. This method is disclosed in Japanese Patent Application No. Hei 4-289780.

A desirable result is not, however, always achieved merely by preparing a thin film having a high dielectric constant through employing the foregoing source materials when a conventional CVD apparatus for liquid source materials is used (e.g., an apparatus for forming $SiO_2$ film). In response to this problem, the inventors have also proposed a CVD apparatus for liquid source materials which is capable of sufficiently vaporizing and feeding the liquid source materials. This apparatus is disclosed in Japanese Laid-Open Patent Publications (unexamined) Nos. Hei 6-310444 and Hei 7-94426.

The inventors have also proposed that coverage can be remarkably improved by changing Ti source material from the popularly employed TTIP [$Ti(O-i-Pr)_4$] to DPM titanyl bis (dipivaloylmethanato) TiO $(DPM)_2$, being the same as Ba or Sr source material. As well, the inventors have discerned that a two-step deposition process can be very effective for obtaining a desirable surface contour, and a desirable electric characteristic, especially as compared with a single layer film. The two steps include a step of crystallizing an initial film (buffer layer) by annealing in the initial stage of film formation, when a relatively amorphous film is easily formed, and a step of depositing a second layer film (main layer). These advances are disclosed in the Japanese Laid-Open Patent Publication (unexamined) No. Hei 7-268634.

A problem still remains. Even when a high dielectric constant thin film is prepared by using the above-mentioned solution vaporizing CVD apparatus, a desirable level of stability (including electric characteristic stability) of the thin film is not always achieved. FIG. 1 is a schematic view of the solution vaporizing CVD apparatus shown in the Japanese Laid-Open Patent Publication (unexamined) No. Hei 7-94426. In the drawing, a $(Ba, Sr)TiO_3$ film is deposited by CVD. Reference numeral 21 designates a substrate, 23 designates a source material gas feed pipe, 24 is an oxidizing agent supply pipe, 31 is a vaporizer, 32 is a reaction chamber, 41 is a dilution gas pipe, 42 is a dilution gas amount regulator, 43 is a pressure pipe, 44 is a liquid source material container, 45 is a liquid source material feeder, 46 is a connection pipe, 47 is a pulverizing nozzle, 48 is a vaporizer heater, 49 is a vaporizing chamber, 50 is a raw material gas feed port, 51 is a feed pipe heater, 52 is a reaction chamber heating mechanism, and 53 is a substrate heater.

In the solution vaporization CVD apparatus of FIG. 1, a dilution gas $N_2$ flows through the dilution gas pipe 41 and connection pipe 46, while the flow rate thereof is regulated by the dilution gas amount regulator 42. Solution source material in the liquid source material container 44 is fed from the pressure pipe 43, through the pulverizing nozzle 47, and into the flowing dilution gas, while being pressurized and controlled by the liquid source material feeder 45. It is then sprayed in the vaporizing chamber 49 of the vaporizer 31. The source material gas vaporized in the vaporizer is fed from the source material gas feed port 50, through the source material gas feed pipe 23, which is heated by the feed pipe heater 51, and to the reaction chamber 32. After reaction with an oxidant in the reaction chamber, a $(Ba, Sr) TiO_3$ film is prepared on the substrate, which is heated by the substrate heater 53.

In the actual apparatus, three liquid source material feed systems (components 43 to 45, as shown in FIG. 1) are respectively provided for Ba, Sr and Ti, and the source materials are fed into one vaporizer. In the reaction chamber, the flow rate of the source materials and the film formation time are controlled under the following conditions: atmosphere of $O_2$, pressure of 1 to 10 Torr, and temperature of 400° to 600° C. The temperature is relatively low because a low temperature provides better coverage. Thereby, a film is formed according to an established target of obtaining a (Ba, Sr) $TiO_3$ film having a component ratio of (Ba+Sr)/Ti=1.0, and a film thickness of 300 Å at a deposition rate of 30 Å/min.

When forming a (Ba, Sr) $TiO_3$ film (BST film, hereafter) by a CVD method employing liquid source materials composed of any DPM organo-metallic compound dissolved in an organic solvent, even if a constant flow rate of the respective source materials (i.e., Ba, Sr, and Ti) is established, there is still the problem of heterogeneous, or uneven, distribution of the Ba, Sr and Ti components in the direction of film thickness. Also, there can be the mixture, or contamination, of the film with carbon, which eventually results in problems such as an unstable electric characteristic, a lowering of the dielectric constant, an increase in the leakage current, a decrease in the film's voltage resistance, etc.

The following section focuses on this problem of the heterogeneous component distribution of Ba, Sr, and Ti.

The conventional solution vaporizing CVD apparatus is constructed such that the DPM compounds containing Ba, Sr or Ti are each stored in different containers, and the supply thereof to the reactor is independently decided. During the deposition of a composite oxide film of those metallic elements on a substrate, the substrate is precisely kept at a certain temperature, within a range of 5° C. or less, by heating a substrate support section with a resistance heater. However, when depositing a BST composite oxide film with this type of film forming apparatus, and with the substrate temperature kept at 420° C., and with the component distribution of the metallic elements, in the film thickness direction, being measured by Auger Electron Spectroscopy (AES), a heterogeneous distribution (as shown in FIGS. 2 and 3) occurs. In each of FIGS. 2 and 3, the abscissa indicates the sputtering time for removing the film, and the ordinate indicates the height of a peak value representing the existence of each element.

FIG. 2 is a component distribution diagram obtained by AES, in the direction of film thickness, of the Ba, Sr, and Ti of a BST film formed via CVD (CVD-BST film, hereafter) for two minutes on a Ru electrode with a constant solution flow rate. The solution was obtained by dissolving solid Ba, Sr, and Ti source materials $Ba(DPM)_2 \cdot Sr(DPM)_2$ and TiO $(DPM)_2$ respectively in THF (Tetrahydrofuran: $C_4H_8O$), an organic solvent. In this film formation process, the deposition rate was about 30 Å/min, and the film thickness was about 60 Å. FIG. 2 shows a trend that the nearer the Ru electrode, the Ti in the film increases, while the Ba and the Sr decrease. This trend, or phenomenon, takes place even though the flow rates of the respective source materials Ba, Sr, and Ti are constant. FIG. 3 shows another component distribution diagram, in the film thickness direction, of a CVD-BST film formed under the same conditions, but on a Pt electrode.

In the foregoing process for forming CVD-BST film, a problem exists in that the amount of the CVD-BST film formed is different, depending on the substrate material (hereinafter referred to as a dependency on the substrate). Even with a substrate made of plural materials and having a patterned surface, there is a similar problem in that the amount of film formed is different from the amount formed on a single material substrate.

Another problem exists in that the surface temperature of the substrate 21 (see FIG. 1) changes due to the deterioration, etc. of a susceptor which holds the heater 53 and the substrate 21, making it impossible to form film under constant temperature conditions for an extended period of time.

Yet another problem exists in that it is impossible to perform a film formation constantly due to clogging, or the like, which occurs during the process of mixing any source material solution with a dilution gas, and supplying it to a vaporizer.

A further problem exists in that the leakage current is large in a thin film structure that is comprised of a conventional thin film having a high dielectric constant, and the electrodes that hold the thin film therebetween.

FIG. 4 is a sectional view showing a stacked capacitor for a DRAM which has a thin film of a high dielectric constant as the dielectric material. This arrangement is shown in Pierre C. Fazan, "Trends in the development of ULSI DRAM capacitors", Integrated Ferroelectrics 1994, Vol.4, pp. 247–256. In FIG. 4, reference numeral 1 designates a silicon substrate; 33 is a cell plate made of platinum, for example; 34 is a film of high dielectric constant; 35 is a storage node made of platinum, for example; 37 is an interlayer insulating film made of silicon dioxide, for example; and 38 is a plug of polysilicon, for example, for electrically connecting the storage node to, for example, a transistor.

Applying the high dielectric constant film CVD to the practical formation of the capacitor shown in FIG. 4 involves the following steps: burying a polysilicon film by CVD in holes, formed by lithography and etching, on the interlayer insulating film 37; forming the plug 38 by removing a portion of the interlayer insulating film 37 deposited on the surface through full surface etching or a chemical mechanical polishing method (CMP method); forming the storage node 35, which is 200 nm in height, by a lithography and etching process of platinum film deposited by sputtering on the plug 38; coating the entire surface of the storage node 35 with the BST film 34, with a thickness of 30 nm, by a CVD method; and forming the cell plate 33 by depositing a platinum film through sputtering. In the capacitor thus formed, a voltage applied between the cell plate 33 and the storage node 35 causes a large electric charge to be stored on the upper and side faces of the storage node 35, due to the high dielectric constant (of about 200) of the BST film 34.

In the above case, in which CVD-BST film was applied to a conventional capacitor structure, when a voltage is applied between the cell plate 33 and the storage node 35, a large field strength is generated in the BST film near the storage node. This field strength is several times greater than the field strength in the remaining part of the BST film, and is due to field concentration. The field concentration results since the thickness of the BST film 34, amounting to 30 nm, is large when compared with the radius of curvature of the shoulder portion 36 of the storage node 35. The radius of curvature of the shoulder portion normally is only about 5 nm. Consequently, when a negative voltage is applied to the storage node, the leakage current due to the Schottky emission current from the storage node 35 increases considerably, making it impossible to hold the electric charge.

A similar field concentration appears also at a lower end 39 of the cell plate 33. Therefore, just as in the case of a negative voltage being applied to the cell plate 33, the leakage current due to Schottky emission current from the cell plate increases considerably, making it impossible to hold the electric charge.

Further, since the BST film 34 is 30 nm in thickness, which is large when compared with the storage node 35 being 200 nm in height, the cell plate 33 is not able to coat the entire side face of the storage node 35. As a result, the entire side face of the storage node 35 is not effectively utilized as electrode of the capacitor. A still further problem exists in that the potentials of adjacent storage nodes interfere with, or negatively affect, each other through the BST film in the cutout portion.

SUMMARY OF THE INVENTION

Accordingly, an object of the present invention is to form a high dielectric constant thin film having a homogeneous component distribution of Ba, Sr and Ti, in film thickness direction.

Another object of the invention is to form a high dielectric constant thin film which is high in dielectric constant and low in leakage current.

A further object of the invention is enhance the thin film production process by preventing clogging by a source material solution which is mixed with a dilution gas and supplied.

A yet further object of the invention is stably to form a high dielectric constant thin film, irrespective of variations in the substrate surface temperature.

A still further object of the invention is to be free from the dependency on substrate in the formation of a high dielectric constant thin film on the basis of surface material of substrate and coating rate.

In accordance with the invention, a method will be described for forming a high dielectric constant thin film. In the method, a BST film is formed by CVD, using a solution obtained by dissolving a Ba DPM compound (serving as Ba source material), a Sr DPM compound (serving as Sr source material), and a Ti DPM compound (serving as Ti source material) respectively in an organic solvent. The method of the invention is characterized in that the ratio of the Ti source material flow rate to the sum of the Ba and Sr source material flow rate is increased during formation of the film.

Using this method, it is possible to form a thin film having a high dielectric constant, and having a homogeneous component distribution of Ba, Sr, and Ti in the film thickness direction.

When performing a multi-stage (multi-step) film deposition and annealing the same after the deposition in each stage (step), a high dielectric constant thin film of less leakage current may be obtained.

In another method for forming a high dielectric constant thin film, in accordance with the invention, a thin film is formed by CVD using a solution obtained by dissolving a Ba DPM compound serving as Ba source material, a Sr DPM compound serving as Sr source material, and a Ti DPM compound serving as Ti source material, respectively, in an organic solvent. This method is characterized by the repeating the alternate formation of $SrTiO_3$ film and $BaTiO_3$ film. Using this method, it is possible to obtain a high dielectric constant thin film with a reduced leakage current.

In another method for forming a high dielectric constant thin film, in accordance with the invention, a (Ba, Sr) $TiO_3$ film is formed by CVD supplying a source material solution obtained by dissolving a Ba DPM compound serving as Ba source material, a Sr DPM compound serving as Sr source material, and a Ti DPM compound serving as Ti source material, respectively, in tetrahydrofuran together with a nitrogen gas. This method is characterized in that, after adding tetrahydrofuran to the nitrogen gas flow, the Ba source material, Sr source material and Ti source material are added thereto to obtain a gas-liquid mixture, and this gas-liquid mixture is then supplied. Using this method, the source material solution is prevented from clogging.

In yet another method for forming a high dielectric constant thin film, in accordance with the invention, a high dielectric constant thin film of metal oxide is formed on a substrate by CVD employing two or more organo-metallic compounds as source materials. This method is characterized in that the deposition of the metal oxide by decomposition of at least one of the organo-metallic compounds depends on the surface temperature of the substrate, and the composition ratio of metallic elements in the deposited film is varied in the film thickness direction by varying a substrate surface temperature during the deposition of the metal oxide thin film. With this method, it is possible to obtain a composition ratio of steep inclination among the metallic elements. Such a ratio is difficult to obtain merely by adjusting the flow rate of the source materials. It is also possible to reduce the leakage current.

In another method for forming a high dielectric constant thin film, in accordance with the invention, a barium strontium titanate (Ba, Sr) $TiO_3$ thin film is formed by CVD on a substrate coated with different materials. This method includes the following steps:

(1) a first step of varying, as parameters, a) the kind and the coating rate of a material with which substrate surface is coated, b) the thickness of the coating material, c) the thickness of the substrate, d) the temperature setting of a heater for heating the substrate, and e) the flow rate of Ti source material, while keeping the respective flow rates of Ba source material and Sr source material at a certain value, depositing a thin film on the substrate, and measuring a composition ratio of the metallic elements;

(2) a second step of measuring values of parameters (1) a) to c), deciding a value of d), establishing a target value of the composition ratio of the metallic elements, and obtaining a flow rate of Ti source material required to achieve the target value, prior to actual formation of thin film; and (3) a third step of forming a thin film in accordance with the flow rate of Ti source material obtained in the second step and the flow rates of Ba source material and Sr source material established in the first step.

In this method, it is possible to be free from the dependency on substrate in the formation of a (Ba, Sr) $TiO_3$ thin film on the basis of substrate surface material and coating rate.

A high dielectric constant thin film manufacturing apparatus in accordance with the invention includes: a reaction chamber in which a thin film is formed by CVD on a substrate; a source material gas feed pipe for feeding a source material gas to the reaction chamber; an oxygen gas feed pipe for feeding an oxygen gas to the reaction chamber; and an infrared sensor disposed in the oxygen gas feed pipe for detecting a surface temperature of the substrate. With this apparatus, even if the substrate surface temperature varies, a high dielectric constant thin film may be stably formed. Further, the DPM source materials may be stably monitored without solidifying on the top end of the sensor.

A high dielectric constant thin film structure, in accordance with the invention, comprises:

an interlayer insulating film disposed on a semiconductor substrate and having a concavity on a part of a surface;

a conductive plug disposed in a hole provided through the interlayer insulating film;

a lower electrode disposed on the plug and on the interlayer insulating film;

a high dielectric constant thin film formed on the lower electrode and on the concavity of the interlayer insulating film;

and an upper electrode formed on the high dielectric constant thin film.

With this structure, it is possible to increase the electric capacity of the high dielectric constant thin film, to prevent field concentration, and to restrain the leakage current.

DETAILED DESCRIPTION OF THE PREFERRED EMBODIMENTS

EXAMPLE 1

Figure 5:
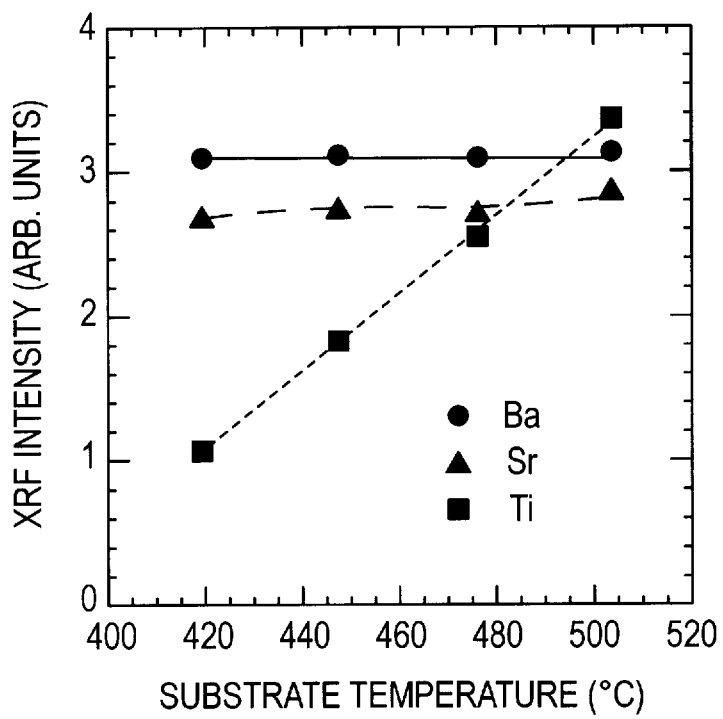
FIG. 5 is a diagram showing a X-ray fluorescent spectroscopy strength of Ba, Sr and Ti of a BST film formed by supplying certain Ba, Sr and Ti solution source materials and varying a substrate temperature.

To clear up the cause of the heterogeneous element distribution of Ba, Sr, and Ti in a BST film, a manner of variation in thermal decomposition velocity of DPM compound containing Ba, Sr, or Ti, with respect to temperature, was clarified through experimentation. FIG. 5 shows the dependency of deposition rate on substrate temperature during deposition of a thin film composed of a single oxide of each metallic element employing a DPM compound containing Ba, Sr or Ti. It is understood from FIG. 5 that the deposition rate of the DPM compound containing Ti is largely dependent on substrate temperature as compared with the remaining DPM compounds containing Ba or Sr, and the deposition rate of the DPM compound containing Ti varies importantly due to a small fluctuation of the substrate temperature in a range of several ° C. Experimentation has shown that the deposition rate at the time of simultaneously introducing DPM compounds, respectively containing Ba, Sr, or Ti, in a reaction container and of depositing a film composed of a composite oxide containing the respective metallic elements, is a sum of each deposition rate of a simple oxide of Ba, Sr, or Ti.

From this experimental result, it is understood that thermal decomposition characteristic of one DPM compound containing Ba, Sr, or Ti remains substantially unchanged, irrespective of existence of the other two. This means that an improvement in the uniformity, or homogeneity, in film composition of a composite oxide film may be achieved simply by stabilizing each deposition rate of the DPM compound containing Ba, Sr, or Ti.

Figure 6:
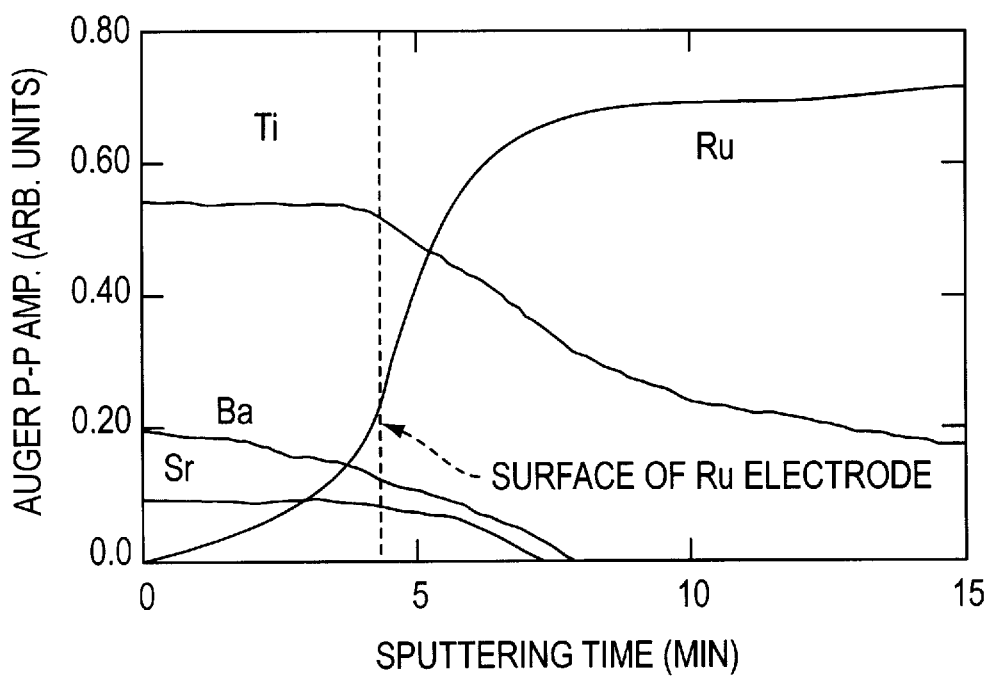
FIG. 6 is a diagram showing a composition, in the film thickness direction, of a BST film formed as an example in accordance with the invention.
Figure 7:
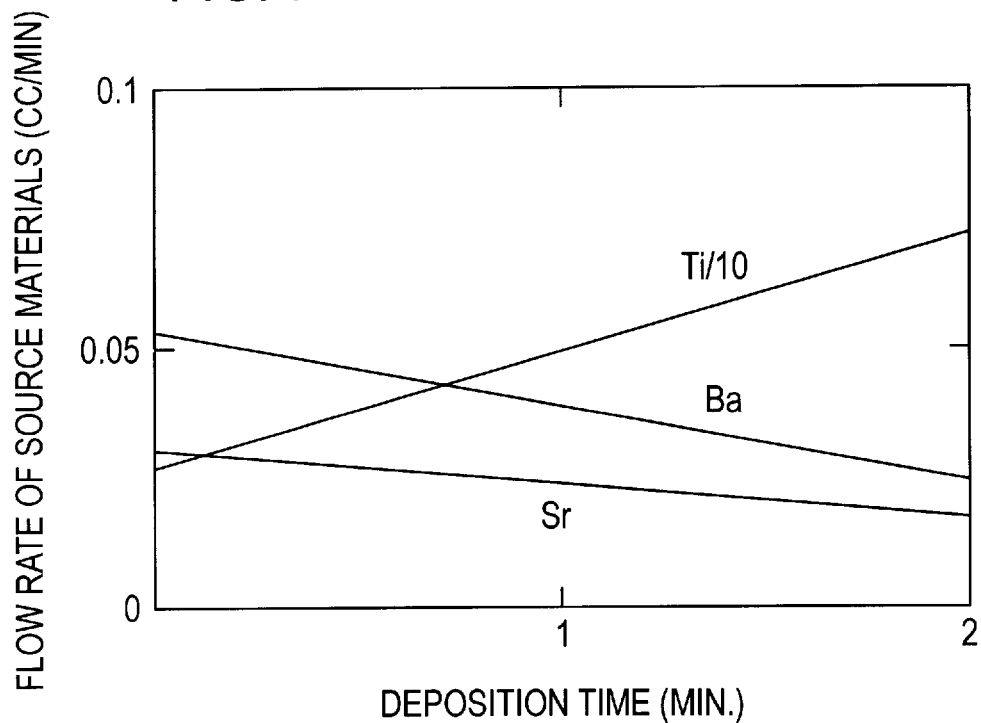
FIG. 7 is a diagram showing a flow rate of the source material used in an example in accordance with the invention.

FIG. 6 is a component distribution diagram, in the film thickness direction, of a buffer layer of CVD-BST film of 60 Å in film thickness. The diagram shows an example of the high dielectric constant thin film which can be formed by applying a method in accordance with the invention; the component distribution diagram was obtained by AES. In this method, as shown in FIG. 7, the flow rate of source material is varied with the passage of time during the film formation. More specifically, flow rate of the Ti raw material solution is increased with the passage of time, while that of the Ba and Sr raw material solutions is reduced forming a film of homogeneous composition in the film thickness direction.

In particular, a lower electrode is formed by sputtering Ru. Then, a first BST film of homogeneous composition, in the film thickness direction, is formed on the lower electrode by varying the flow rate of the source material solutions as shown in FIG. 7. This first BST film is annealed under a nitrogen atmosphere. A second BST film is formed on the first BST film by CVD. The second BST film is annealed under the nitrogen atmosphere, and an upper electrode is formed by sputtering Ru on the annealed second BST film. The first BST film will hereinafter be referred to as a buffer layer, and the second BST film as a main layer. Composition of the buffer layer is even, or homogeneous, in the film thickness direction, as shown in FIG. 6. It is also preferable to form the lower and upper electrodes by sputtering Pt in place of Ru.

Figure 1:
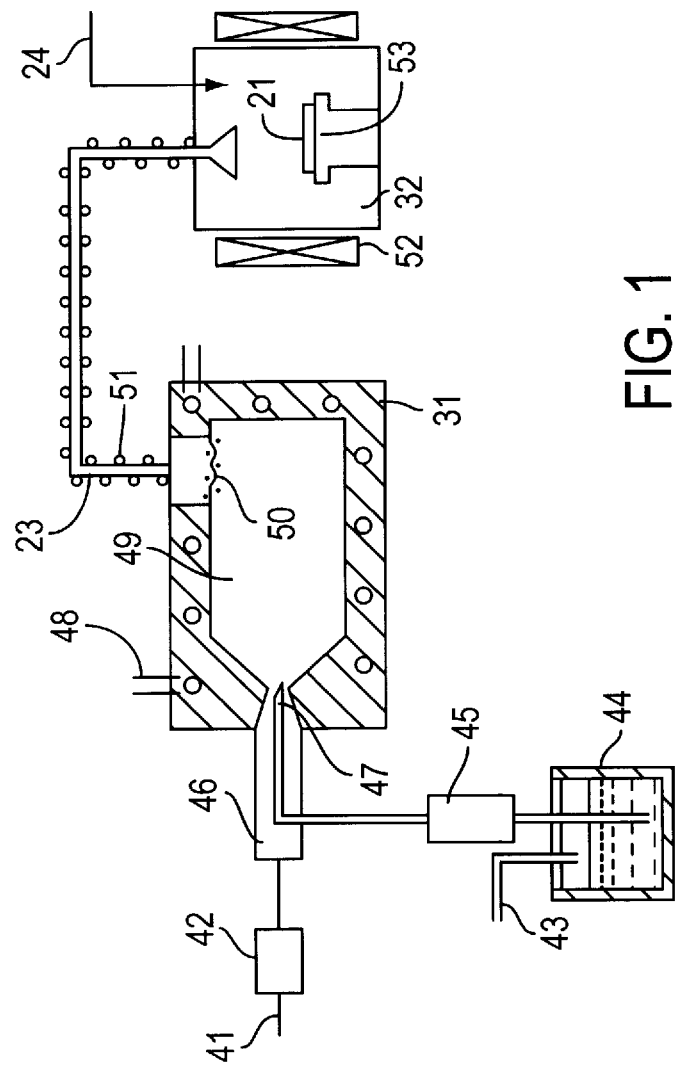
FIG. 1 is a schematic view showing a conventional method and apparatus for forming a high dielectric constant thin film.
Figure 2:
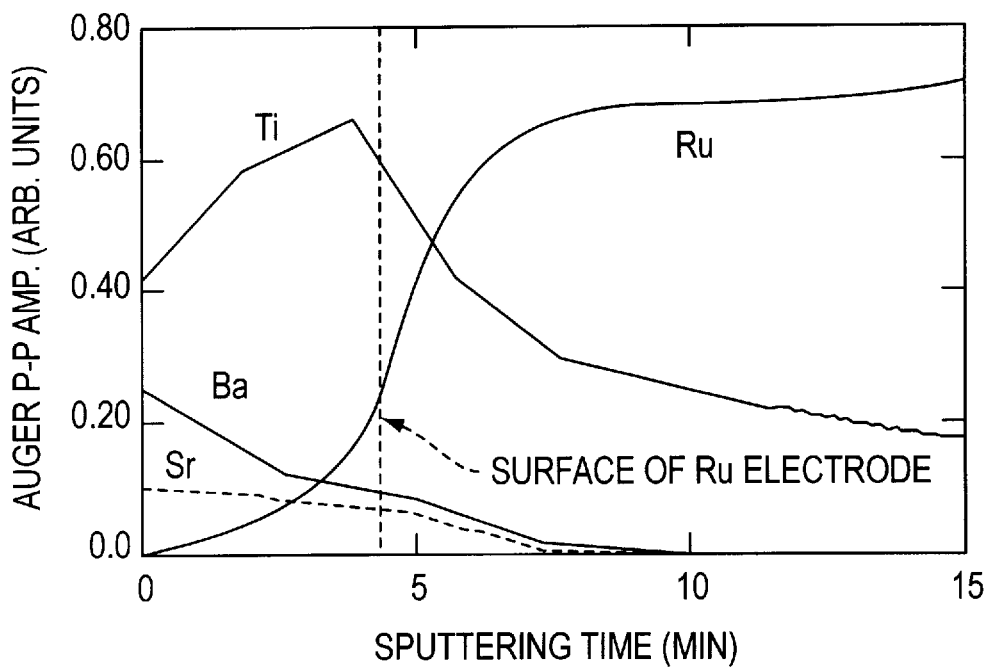
FIG. 2 is a component distribution diagram in depth direction (i.e., the film thickness direction) of a BST film formed on a Ru electrode by a conventional method for forming the high dielectric constant thin film.

The flow rate of the Ba, Sr, and Ti source material solutions is constant at the time of forming the main layer on the conditions shown in FIG. 1, and a total film thickness of the buffer layer and the main layer is about 240 Å. The annealing conditions of the buffer layer are 640° C., $N_2$ atmosphere and 10 sec, and those of the main layer are 625° C., $N_2$ atmosphere and 10 sec. As for the annealing condition of the buffer layer, 630° C. to 650° C. is preferable in view of sufficient crystallization. As for the main layer, it is certain that annealing is necessary for crystallization, but leakage current is increased if the annealing temperature is excessively high and, therefore, 610° C. to 640° C. is preferable for annealing the main layer.

The conditions for forming the buffer layer, except for the respective flow rates of Ba, Sr, and Ti source material solutions, are as shown in Table 1.

TABLE 1

| | | |
|---|---|---|
| Source material flow rate | Ba(DPM)$_2$/THF (0.1 mol/L) | 0.04 cm$^3$/min |
| | Sr(DPM)$_2$/THF (0.1 mol/L) | 0.03 cm$^3$/min |
| | TiO(DPM)$_2$/THF (0.1 mol/L) | 0.5 cm$^3$/min |
| Carrier gas flow rate | Carrier $N_2$ flow rate | 200 sccm |
| Vaporization temperature | Vaporizer temperature | 25° C. |
| Vapor pressure | Vaporizer pressure | 20 Torr |
| Oxidizing agent flow rate | $O_2$ flow rate | 1 slm |
| Reaction capacity pressure | Reactor pressure | 1.5 Torr |
| Substrate temperature | Substrate temperature | 420° C. |
| Substrate material | Ru(2000Å)/SiO$_2$ | (5000Å)/Si |
| | or Pt(700Å)/SiO$_2$ | (5000Å)/Si |

A target flow rate of the Ba, Sr, and Ti source material solutions in Table 1 is a composition ratio (Ba+Sr)/Ti=0.8. In Table 1, another composition ratio (Ba+Sr)/Ti=1.0 may be targeted either by reducing the flow rate of Ti source material solution by 20% or by increasing the flow rate of Ba and Sr source material solutions by 25%.

A further composition ratio (Ba+Sr)/Ti=1.2 may be targeted either by reducing the flow rate of Ti source material solution by 33% or by increasing the flow rate of Ba and Sr source material solutions by 50%. In this manner, by either increasing or reducing the flow rate of Ba, Sr, and Ti source material solutions, any composition ratio of (Ba+Sr)/Ti may be freely established. Ba(DPM)$_2$/THF, Sr(DPM)$_2$/THF, and TiO(DPM)$_2$/THF are solutions obtained by dissolving bis (dipivaloylmethanato) barium [Ba(DPM)$_2$], bis (dipivaloylmethanato) strontium [Sr(DPM)$_2$] and titanyl bis (dipivaloylmethanato) [TiO(DPM)$_2$] respectively in tetrahydrofuran.

Figure 8:
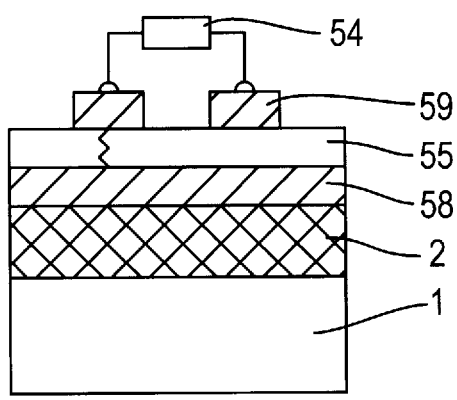
FIG. 8 is a schematic view of a circuit for measuring the electric characteristic of a BST film.

The electric characteristic of the BST film formed as described above is then measured. The upper electrode, Pt or Ru of 1 mm in diameter, is further formed by sputtering on the BST film formed over the lower electrode, also Pt or Ru, and the electric characteristics such as leakage current, film thickness calculated in terms of oxide film, etc., are measured by means of an electrical circuit as shown in FIG. 8. In this drawing, reference numeral 1 designates a Si substrate, 2 designates a SiO$_2$ film, 59 is a cell plate (upper electrode), 58 is a storage node (lower electrode), 54 is an impedance analyzer, and 55 is a CVD-BST film.

Table 2 shows the result of measuring the leakage current in a structure produced as described above in comparison with the conventional art. It is understood from Table 2 that the film, of which the buffer layer has a homogeneous component distribution, in the film thickness direction, produced in accordance with the invention, is superior to a comparative example 1, which has a buffer layer with a conventional component distribution in the film thickness direction. The structure produced according to the invention has a superior electric characteristic.

TABLE 2

| | Film thickness $t_{eq}$ calculated in terms of oxide film | Leakage current $J_L$ (at +1.1 V) |
|---|---|---|
| Comparative example 1 | 0.56 nm | 8.1 × 10$^{-8}$ A/cm$^2$ |
| Example 1 | 0.50 nm | 2.1 × 10$^{-8}$ A/cm$^2$ |

EXAMPLE 2

Figure 9:
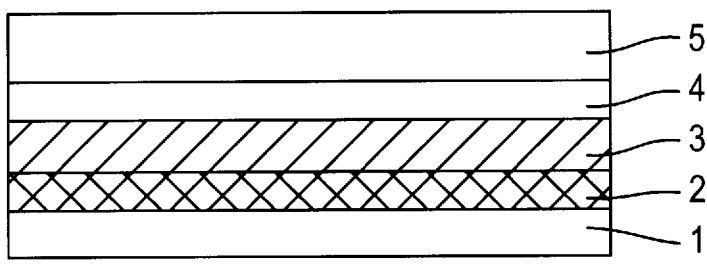
FIG. 9 is a sectionally schematic view of the BST film formed in an example in accordance with the invention.

FIG. 9 is a sectional view of a film showing another example of the high dielectric constant thin film forming method in accordance with the invention. In the drawing, reference numeral 1 designates a Si substrate, 2 designates a $SiO_2$ film, 3 is a lower Ru electrode, 4 is an initial BST film deposited for two minutes at a target composition ratio of (Ba+Sr)/Ti=1.2 to 1.4, and 5 is an upper BST film deposited for six minutes at a target composition ratio of (Ba+Sr)/Ti= 0.6 to 0.8.

Figure 10:
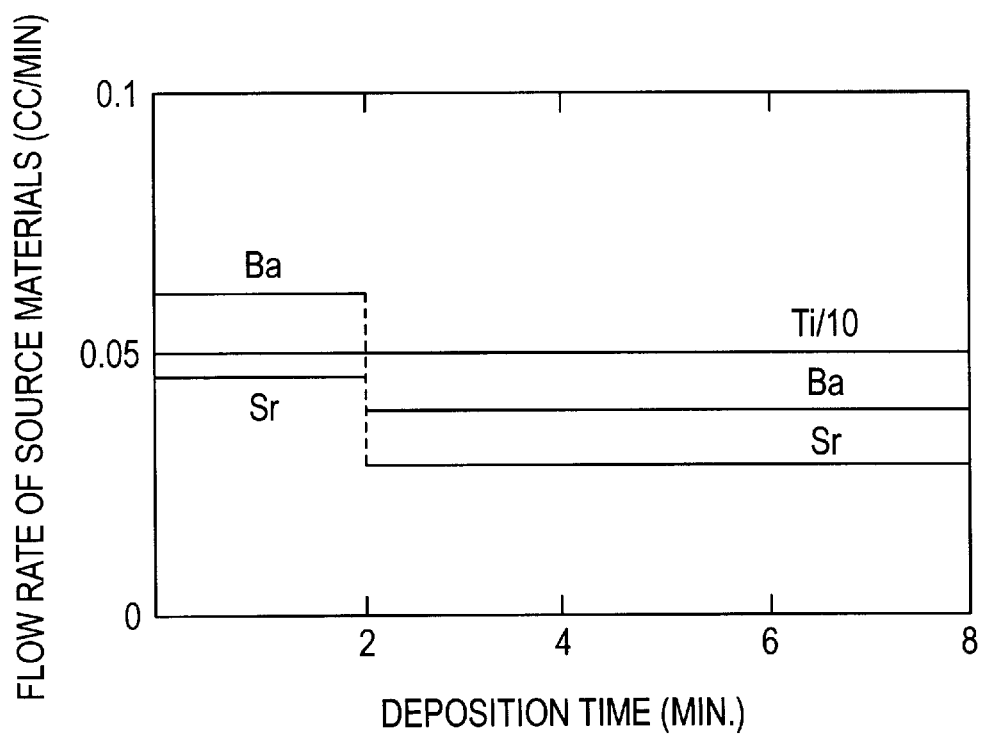
FIG. 10 is a diagram showing a flow rate of the source martial used in an example in accordance with the invention.

A two-step film formation involves forming a main layer on a buffer layer obtained by crystallizing a BST film by annealing in the initial stage of film formation, when a relatively amorphous film is easily formed. It is effective in such a process to vary the ratio of total flow rate of Ba and Sr solution source materials to that of Ti solution source material depending upon whether the buffer layer or the main layer is being formed, as shown in FIG. 10. Thereby, it is possible to obtain a film in which the sum of the composition ratio of Ba and Sr to Ti is relatively homogeneous in film thickness. In FIG. 10, the flow rate of the source materials for forming the buffer layer is shown for first two minutes, and the flow rate of the source materials for forming the main layer is shown for six minutes thereafter. The film formation conditions are same as those shown in FIG. 1, except for the flow rate of the source materials. Table 3 shows the respective electric characteristics of two CVD-BST films. The first was obtained as example according to the invention, and the second was produced according to the conventional method. In the comparative example, both of the buffer layer and main layer were formed at a target ratio of (Ba+Sr)/Ti=0.7 to 0.8. It is understood from Table 3 that the invention is advantageous. The annealing condition of the buffer layer and the main layer were the same as those of example 1.

TABLE 3

| | Film thickness $t_{eq}$ calculated in terms of oxide film | Leakage current $J_L$ (at +1.1 V) |
|---|---|---|
| Comparative example 1 | 0.56 nm | $8.1 \times 10^{-8}$ A/cm$^2$ |
| Example 2 | 0.52 nm | $2.5 \times 10^{-8}$ A/cm$^2$ |

EXAMPLE 3

Figure 11:
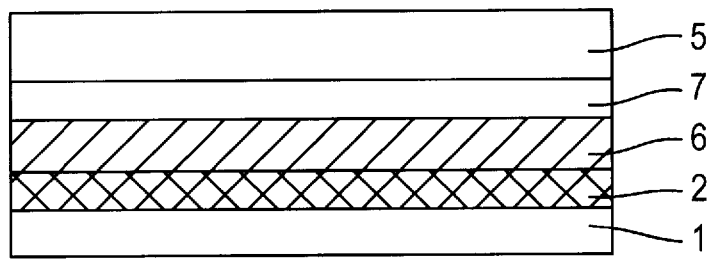
FIG. 11 is a sectionally schematic view of the BST film formed in an example in accordance with the invention.
Figure 12:
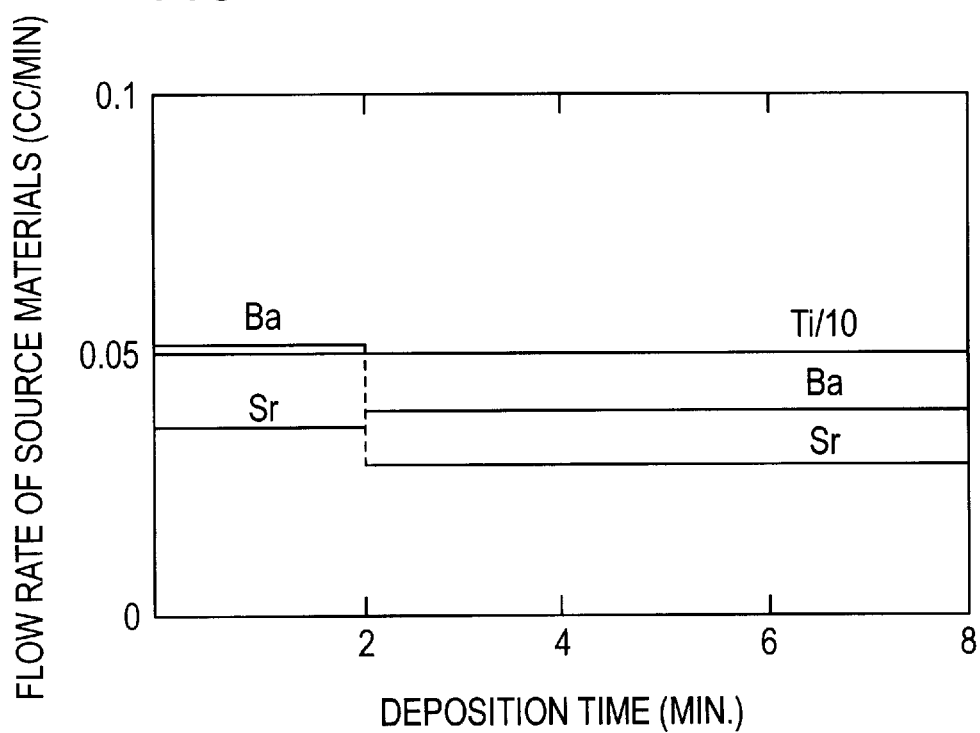
FIG. 12 is a diagram showing a flow rate of the source martial used in several examples in accordance with the invention.

FIG. 11 is a sectional view of a BST film formed according to a further example of the high dielectric constant thin film forming method, in accordance with the invention. In the drawing, reference numeral 6 designates a Pt electrode, 7 is an initial BST film deposited at a target composition ratio of (Ba+Sr)/Ti=0.9 to 1.1, and 5 is an upper BST film deposited at a target composition ratio of (Ba+Sr)/Ti=0.7 to 0.8. In forming a film in two steps, it is effective to vary the ratio of the total flow rate of the Ba and Sr solution source materials to that of the Ti solution source material depending upon whether the buffer layer or the main layer is formed, as shown in FIG. 12. Thereby it is possible to obtain a film in which the sum of the composition ratio of Ba and Sr to Ti is relatively homogeneous in film thickness direction. The annealing condition of the buffer layer and the main layer were the same as those of example 1.

Figure 3:
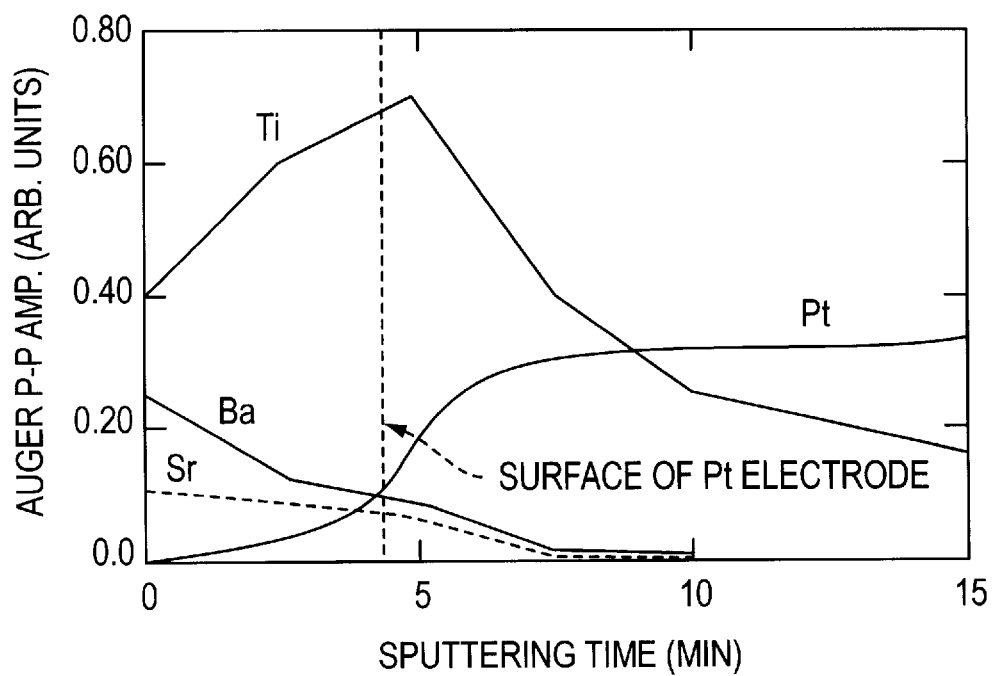
FIG. 3 is a component distribution diagram in depth direction of a BST film formed on a Pt electrode by the conventional method for forming the high dielectric constant thin film.
Figure 4:
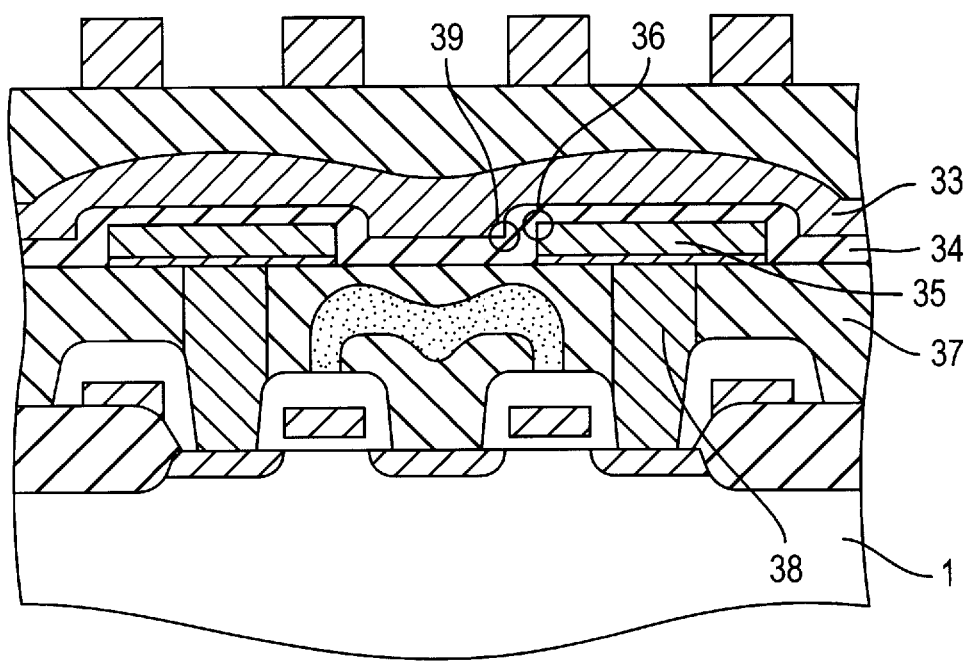
FIG. 4 is a sectional view showing a structure of the conventional high dielectric constant thin film.

Referring to FIG. 3, in which is shown an AES component distribution diagram of the film thickness of the buffer layer (formed for two minutes on Pt according to the conventional method), the position of the largest peak is located near the Pt electrode side. Perhaps this is because Ti enters inside Pt. Accordingly, it is preferable that, in the composition of the buffer layer, Ti is applied to Pt in a larger amount as compared with that of example 1, in which a Ru electrode was used. In other words, the composition ratio (Ba+Sr)/Ti should be smaller. The film formation conditions are same as those shown in FIG. 1, except for the flow rate of the source materials. Table 4 shows the electric characteristics of two CVD-BST films, the first having been obtained according to the invention, and the second having been produced according to the conventional method, and in the comparative example, both of the buffer layer and the main layer were formed at a target of (Ba+Sr)/Ti=0.7 to 0.8. It is understood from Table 4 that the invention is advantageous.

TABLE 4

| | Film thickness $t_{eq}$ calculated in terms of oxide film | Leakage current $J_L$ (at +1.1 V) |
|---|---|---|
| Comparative example 2 | 0.60 nm | $1.7 \times 10^{-7}$ A/cm$^2$ |
| Example 3 | 0.56 nm | $4.5 \times 10^{-8}$ A/cm$^2$ |

EXAMPLE 4

Figure 13:
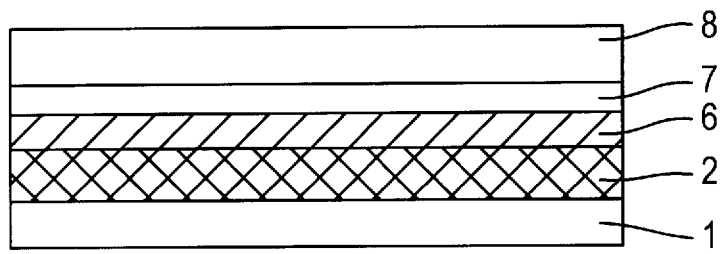
FIG. 13 is a sectionally schematic view of the BST film formed in an example in accordance with the invention.

FIG. 13 is a sectional view of a film deposited on a Pt electrode according to a further example of the high dielectric constant thin film forming method in accordance with the invention. In the drawing, reference numeral 8 designates an upper BST film annealed once at a temperature of 610° to 640° C. Usually, the annealing conditions of the main layer are: 625° C. (in the range of 610° to 640° C.), $N_2$ atmosphere, and 10 sec. The usual annealing conditions of the buffer layer are: 640° C., $N_2$ atmosphere, and 10 sec. The flow rate of the solution source materials is same as that shown in FIG. 12, and the other conditions of film formation are same as those shown in Table 1.

Figure 14:
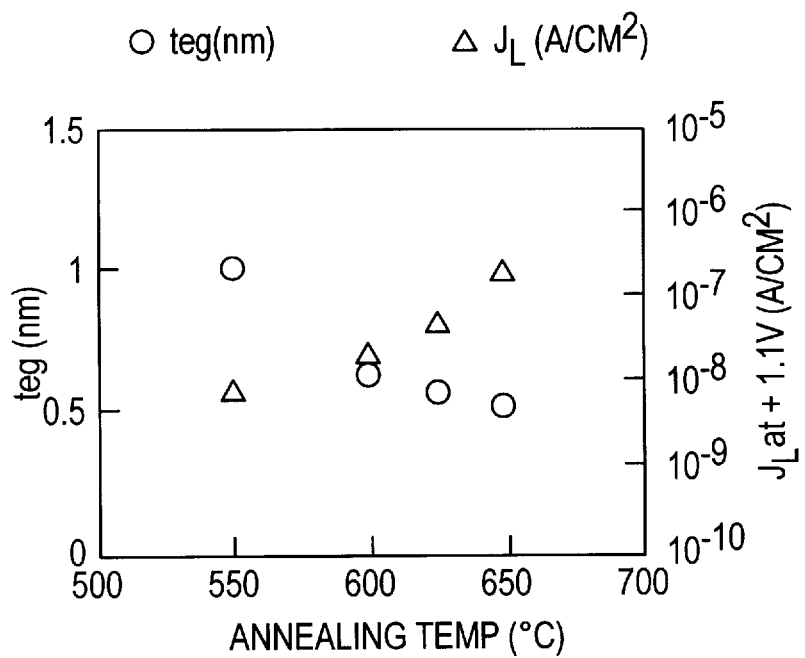
FIG. 14 is a diagram showing a relation between annealing temperature and electric characteristic of the BST film formed in an example in accordance with the invention.
Figure 15:
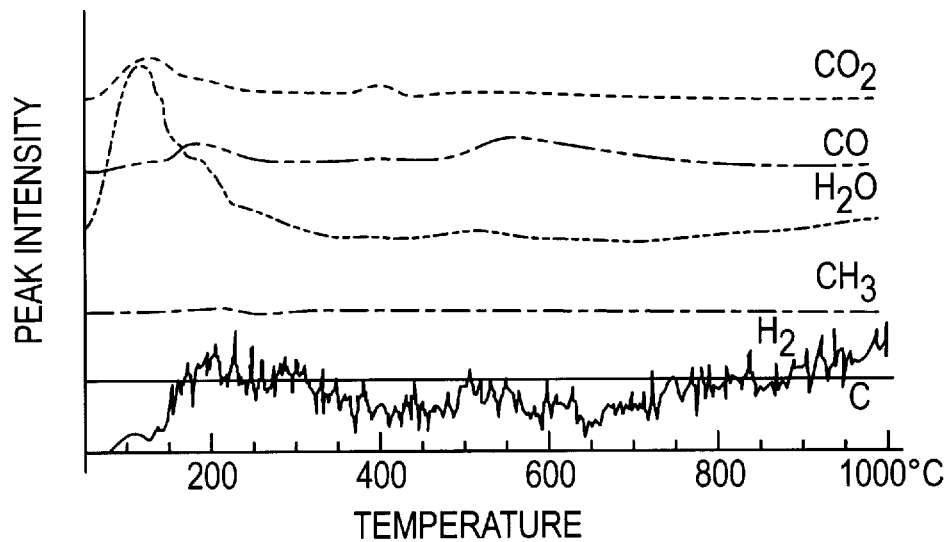
FIG. 15 is a diagram showing temperature rise degassing analysis of the BST film formed in an example in accordance with the invention.
Figure 16:
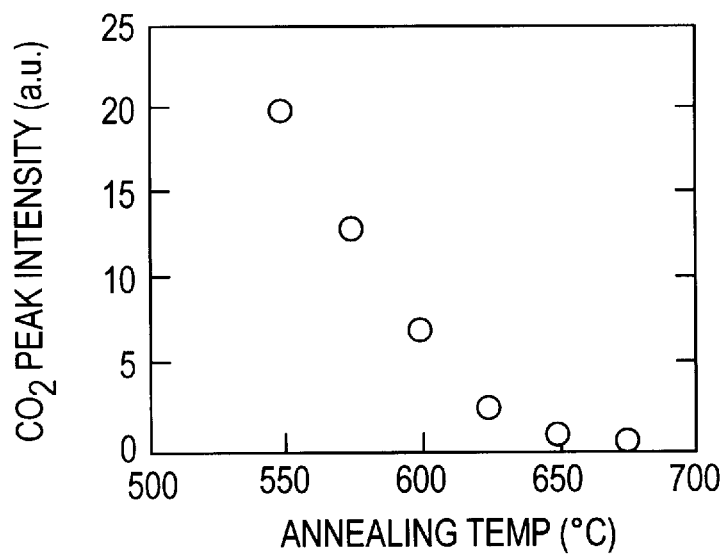
FIG. 16 is a diagram showing a relation between annealing temperature and $CO_2$ peak strength of the BST film formed in an example in accordance with the invention.

FIG. 14 shows the relation between the annealing temperature and electric characteristic of the main layer, and it is understood from FIG. 14 that the electric characteristic at an annealing temperature of 625° C. is most preferable, which shows an advantage of the invention. FIG. 15 shows a result of mass spectrometry of temperature rise and degassing of CVD-BST film without annealing the main layer, and it is to be understood from FIG. 15 that $CO_2$ (m/e=44) and $H_2O$ (m/e=18) are detected as degassing at about 150° C. FIG. 16 shows a relation between the peak intensity of $CO_2$ and the annealing temperature of the main layer. It is to be understood from FIG. 16 that carbon and similar contaminants. mixed into the BST film are removed by annealing, and an annealing temperature of about 625° C. is required in order sufficiently to remove them. It is presumed that the carbon compound in the film is decomposed by annealing, and is discharged in the form of $CO_2$, whereby the leakage current can be further reduced.

EXAMPLE 5

Figure 17:
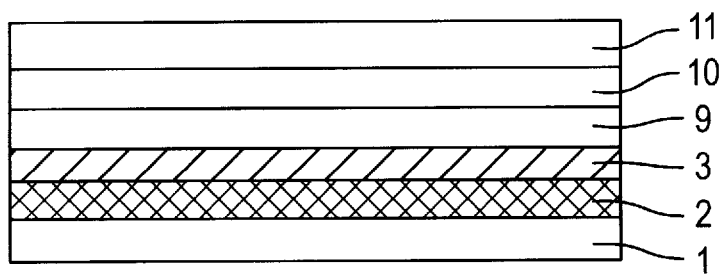
FIG. 17 is a sectionally schematic view of the BST film formed in an example in accordance with the invention.

FIG. 17 is a sectional view of a film formed up to a third layer (third stage) by multilayer (multistage) film formation on a Pt electrode in accordance with the invention. In FIG. 17, reference numeral 9 designates a buffer layer to which annealing has been applied three time, 10 designates a second film to which annealing has been applied twice, and 11 is a third film to which annealing has been once. The annealing conditions of the buffer layer are 640° C., $N_2$ atmosphere, and 10 sec. The annealing conditions of the second and third films are 625° C., $N_2$ atmosphere, and 10 sec. The flow rate of source material solutions is same as that shown in FIG. 12, and the other film formation conditions are same as those shown in Table 1. It takes two minutes to deposit the buffer layer, three minutes to deposit the second film and three minutes to deposit third film. By performing annealing three times, the carbon amount remaining at 625° C. is further reduced, as shown in FIG. 16. Table 5 shows the electric characteristic of this example 5 in comparison with the two step film formation according to example 3, and it is to be understood that the leakage current is smaller. This example clearly is more effective and advantageous. It is presumed that carbon is reduced by repeating the annealing, whereby leakage current is reduced.

TABLE 5

|  | Film thickness $t_{eq}$ calculated in terms of oxide film | Leakage current $J_L$ (at +1.1 V) |
| --- | --- | --- |
| Example 3 | 0.56 nm | $4.5 \times 10^{-8}$ A/cm$^2$ |
| Example 5 | 0.50 nm | $9.5 \times 10^{-9}$ A/cm$^2$ |

EXAMPLE 6

Figure 18:
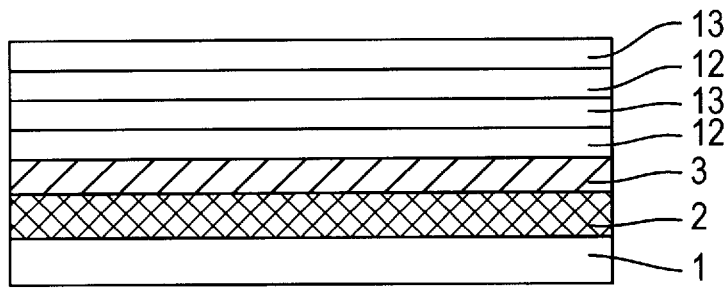
FIG. 18 is a sectionally schematic view of the BT film and ST film formed in an example in accordance with the invention.
Figure 19:
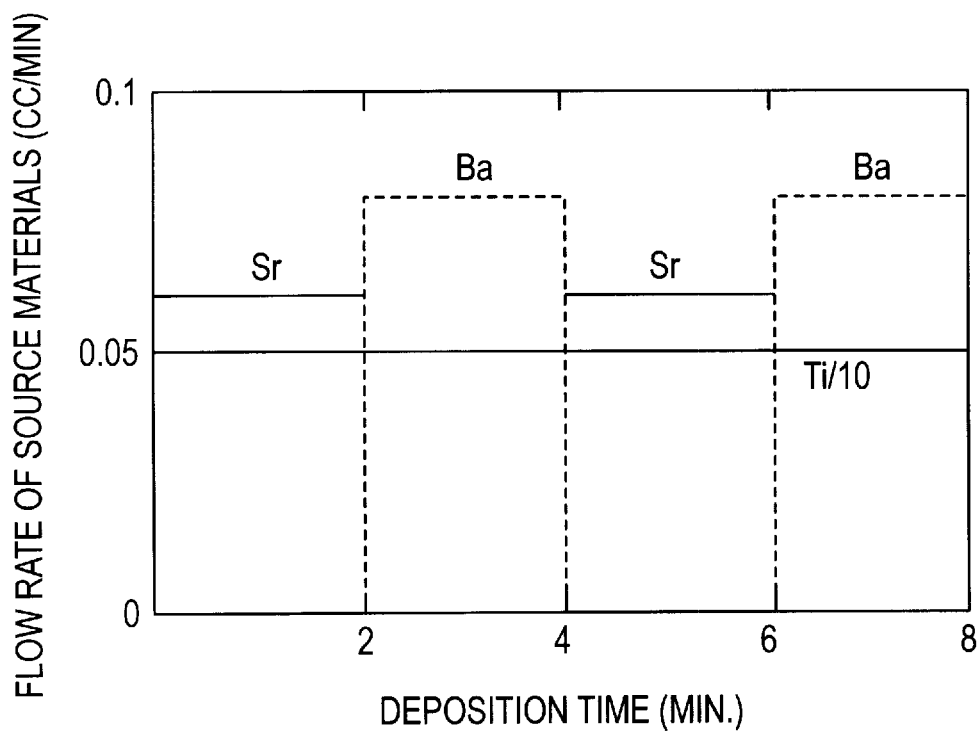
FIG. 19 is a diagram showing a flow rate of the source material used in the formation of the film shown in FIG. 14.

FIG. 18 is a sectional view of a film formed layer-by-layer on a Pt electrode according to a further example of the invention. In FIG. 18, reference numeral 12 designates a SrTiO$_3$ film, which is relatively easily crystallized, and 13 designates a BaTiO$_3$ film, which is relatively easily made amorphous. FIG. 19 shows the flow rate of source material solutions during formation of the SrTiO$_3$ film, which is deposited for two minutes after starting the film formation (i.e., during the period from the film formation starting time to 2 min) and for another two minutes after the lapse of four minutes (i.e., during the period from four min to 6 min), and BaTiO$_3$ film, which is deposited for two minutes after the lapse of the first two minutes (i.e., during the period from 2 min to 4 min), and for another two minutes after the lapse of the first six minutes (i.e.. during the period from 6 min to 8 min). Further, after forming the respective films, an annealing is applied to them at 625° C. under a N$_2$ atmosphere for 10 sec. The remaining conditions of film formation are same as those of Table 1.

Table 6 shows the electric characteristics of the CVD-BST film formed in the layer-by layer film formation method compared with those of the film formed in example 3, and it is to be understood from Table 6 that forming the film layer-by-layer is more advantageous. Generally, it is said that SrTiO$_3$ film is easier to crystallize than BaTiO$_3$ film. Thus, it is presumed that because a film of superior crystallization is obtained by forming a SrTiO$_3$ film at the initial stage of film formation and the BaTiO$_3$ film is relatively amorphous, the grain size is small resulting in restraint of the leakage current. It is to be noted that the leakage current is large in prismatic crystal, but not in amorphous crystal.

TABLE 6

|  | Film thickness $t_{eq}$ calculated in terms of oxide film | Leakage current $J_L$ (at +1.1 V) |
| --- | --- | --- |
| Example 3 | 0.56 nm | $4.5 \times 10^{-8}$ A/cm$^2$ |
| Example 6 | 0.52 nm | $6.2 \times 10^{-9}$ A/cm$^2$ |

EXAMPLE 7

Figure 20:
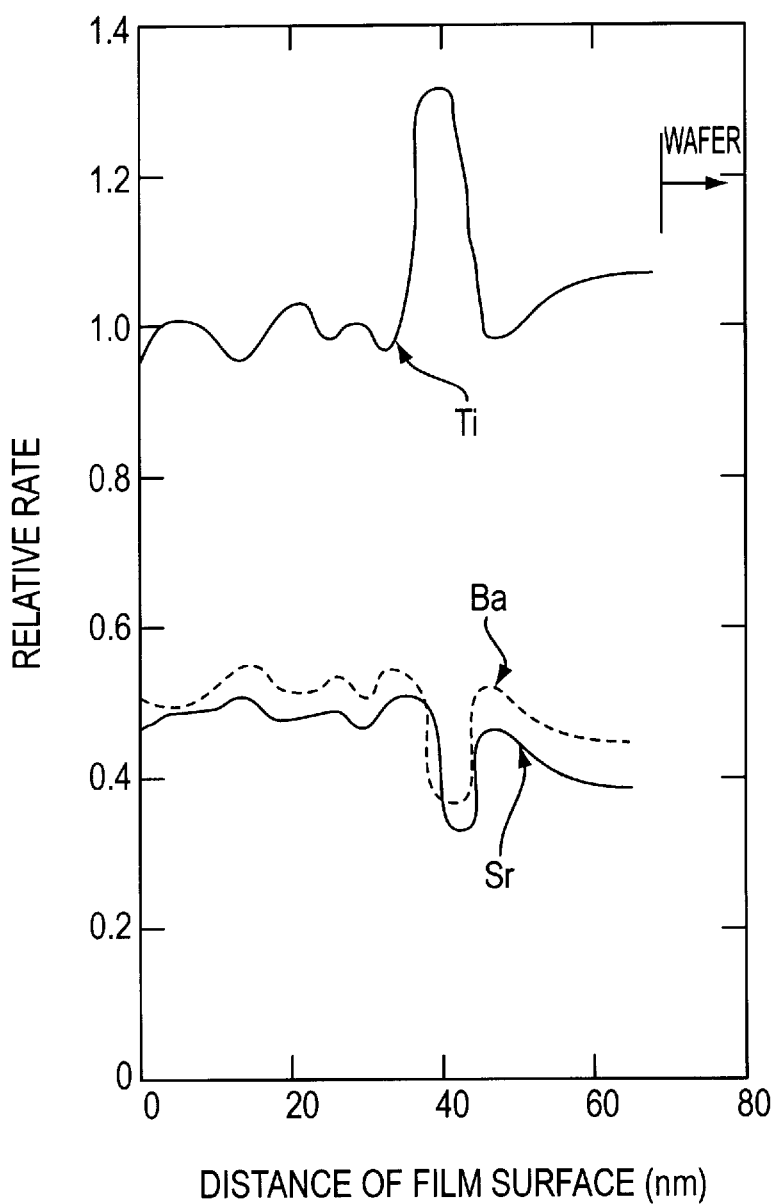
FIG. 20 is a diagram showing a composition in film thickness direction of a BST film formed in an example in accordance with the invention.

FIG. 20 is a schematic diagram showing composition of the BST film obtained according to an example of the high dielectric constant thin film forming method in accordance with the invention. In this example, for each DPM compound containing Ba, Sr or Ti, it is utilized that thermal decomposition velocity on the substrate surface depends upon temperature only in the DPM compound containing Ti. A target composition ratio of the composite oxide at this time is Ba:Sr:Ti=1:1:2.

This composition ratio varies sensitively depending upon substrate temperature. For example, it is understood from FIG. 5 that when the substrate temperature is 500° C., the abundance ratio of Ti is increased to the extent of Ba:Sr:Ti=1:1:3. It is understood that since the composition ratio depends largely upon the substrate temperature, the composition of a depositing film may be controlled by changing the substrate temperature during the process of film deposition. Formation of a region of large Ti composition ratio at a certain depth of a thin film of which composition ratio is Ba:Sr:Ti=1:1:2 is effective for improving the insulating characteristic of the BST film. To achieve such an improvement, it may be said effective to utilize the dependency of the composition ratio upon the substrate temperature in the mentioned film formation.

A result of an actual experiment is hereinafter described. A wafer was heated by infrared radiation, the flow rate of the solution source materials was the same as that shown in FIG. 12, and the remaining conditions were same as those shown in Table 1. In this two step film formation, a main layer was formed by deposition while heating a substrate temperature to 500° C. by increasing the output of an infrared heater for 30 sec after the first two minutes (i.e., during the period from first 2 min to 2 min and 30 sec) of six minutes, and then lowering the substrate temperature to 420° C.

FIG. 20 shows a result of composition ratio in the film evaluated by AES. It is understood from FIG. 20 that, with regard to the portion deposited at a substrate temperature of 420° C., the targeted composition ratio of Ba:Sr:Ti=1:1:2 was substantially achieved, and the abundance ratio of Ti was increased to about Ba:Sr:Ti=1:1:3 only at the portion where substrate temperature was raised.

The sharp variation shown in FIG. 20 means that this film formation method is effective for achieving a stepwise variation in the composition ratio distribution. It is to be noted that in supplying the DPM compounds containing Ba, Sr, and Ti, at least one compound is supplied to a reactor at a feed rate to be rate-determined by thermal decomposition reaction temperature on the substrate surface and, therefore, it is possible to modulate a film composition easily and sharply by changing the substrate temperature during the process of film formation. Thus, it became possible to deposit a composite oxide film of the desired component distribution. Such a sharp variation in composition is never achieved merely by controlling the flow rate of the source materials.

Figure 21:
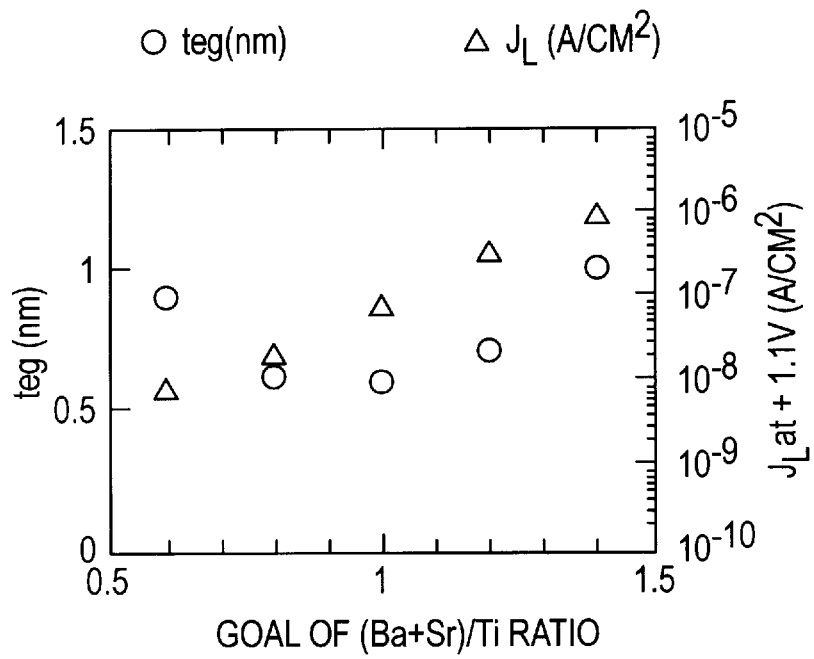
FIG. 21 is a diagram showing a relation between a target ratio (Ba+Sr)/Ti of the upper substrate film and electric characteristic in an example in accordance with the invention.

Table 7 shows the electric characteristics of the CVD-BST film actually obtained in comparison with example 3, and it is understood from Table 7 that the leakage current is reduced. FIG. 21 shows a relation between the composition ratio and the electric characteristics of the main layer, and it is understood from FIG. 21 that when controlling the flow rate of solution materials so that (Ba+Sr)/Ti ratio may be small, BaCO$_3$ or SrCO$_3$ is difficult to form, i.e., the amount of C contained as impurity in the film is less, thereby decreasing the leakage current. When such a main layer is interposed, even if it is a thin film, a BST film of less leakage current may be obtained.

Although variation in the substrate temperature is 50° C. in this example, a modulation in composition ratio enabling a sufficient characteristic change may be achieved when the temperature change is 10° C. or more with reference to the relation shown in FIG. 5. Although DPM compounds containing Ba, Sr, or Ti are employed as organo-metallic compounds in this example, the same advantage may be achieved when two or more organo-metallic compounds not affecting each other in the reaction of thermal decomposition are employed. For example, Ca, Pb, Bi, Ta, Nb, etc. are available as a metallic element to be contained in an organo-metallic compound, other than Ba, Sr and Ti.

TABLE 7

| | Film thickness $t_{eq}$ calculated in terms of oxide film | Leakage current $J_L$ (at +1.1 V) |
|---|---|---|
| Example 3 | 0.56 nm | $4.5 \times 10^{-8}$ A/cm$^2$ |
| Example 7 | 0.54 nm | $2.2 \times 10^{-8}$ A/cm$^2$ |

EXAMPLE 8

Figure 22:
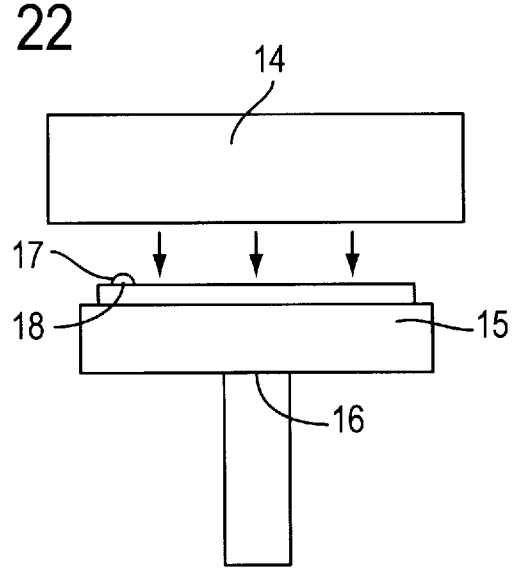
FIG. 22 is a view showing how to measure wafer temperature in an example in accordance with the invention.
Figure 23:
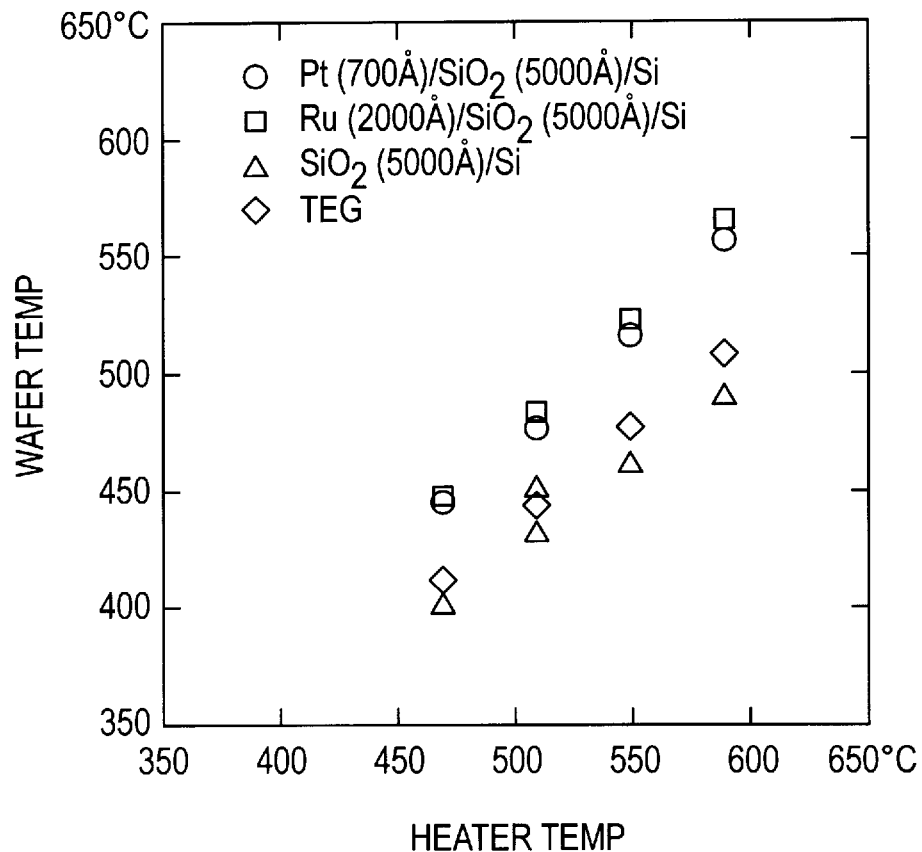
FIG. 23 is a diagram showing a relation between heater set temperature and substrate surface temperature in an example in accordance with the invention.

FIG. 22 is a schematic view showing an example of the high dielectric constant thin film forming method in accordance with the invention, by which the dependency on substrate surface is eliminated. In FIG. 22, reference numeral 14 designates a shower nozzle for feeding vaporized raw materials together with $N_2$ gas, numeral 15 designates a heater, 16 is a thermocouple for measuring heater temperature, 17 is a thermocouple for measuring wafer surface temperature, and 18 is a conductive resin. FIG. 23 shows wafer surface temperatures on a substrate of various materials measured by setting the thermocouple 17 shown in FIG. 22 on the wafer surface.

The substrates whose temperatures are shown in FIG. 23 include, first, a Pt(700 Å)/SiO$_2$(5000 Å)/Si substrate composed of SiO$_2$ of 5000 Å in thickness formed on the entire surface of a silicon substrate of 0.6 mm in thickness, and a Pt film of 700 Å in thickness further formed on the entire surface of the silicon substrate. The Pt coating is 100%. The second substrate, a Ru(2000 Å)/SiO$_2$(5000 Å)/Si, is composed of SiO$_2$ of 5000 Å in thickness formed on the entire surface of a silicon substrate of 0.6 mm in thickness, and a Ru film of 2000 Å in thickness further formed on the entire surface of the silicon substrate. The Ru coating is 100%. The third substrate, SiO$_2$(5000 Å)/Si, is composed of a SiO$_2$ film of 5000 Å in thickness formed on the entire surface of a silicon substrate of 0.6 mm in thickness. The Ru coating and Pt coating are both 0%. The fourth item shown is a Test Element Group (TEG), composed of a SiO$_2$ film of 5000 Å in thickness formed on the surface of a silicon substrate of 0.6 mm in thickness, and a Pt film of 700 Å in thickness further formed thereon coating 35% of the surface.

The conductive resin 18 (see FIG. 22) is employed to exactly bring the thermocouple into contact with the wafer surface and measure exactly the wafer surface temperature. For example, when the heater set temperature was 510° C., the Ru upper surface temperature was 480° C., the Pt surface temperature was 475° C., and the SiO$_2$ upper surface temperature was 430° C. Accordingly, it is to be understood that the wafer surface temperature varies depending upon the various materials coating the silicon substrate. The following, "a" to "d," indicate the parameters involved in wafer surface temperature:

a: the kind of and the coating percentage of the material coating the silicon substrate surface;

b: the thickness of the coating material;

c: the thickness of the silicon substrate; and d: the heater temperature setting.

The wafer temperature varies according to variation of the parameters "a" to "d." When varying the wafer surface temperature, the composition ratio (Ba+Sr)/Ti of the metallic elements in the (Ba, Sr) TiO$_3$ film also varies. This is because, as shown in FIG. 5, when varying the wafer surface temperature, the deposition rate of Ba oxide and Sr oxide does not vary, but the deposition rate of Ti oxide varies greatly.

After all, the variation in the kind and coating percentage of the material coating the silicon substrate surface results in a variation in the composition ratio (Ba+Sr)/Ti of the metallic elements in the deposited film.

To cope with this, in case of variation in wafer surface temperature due to variation in the parameters "a" to "d", it is preferable to control the flow rate of the source materials so that the variation in deposition rate may be free from (i.e., offset by) the variation in wafer surface temperature. As the deposition rate of Ti oxide varies depending upon the wafer surface temperature and flow rate of Ti source material, the deposition rate may be kept constant by adjusting one according to a variation of the other. Under the condition of keeping constant the flow rate of Ba source material and Sr source material, it is preferable to use only the Ti source material flow rate among the three source material flow rates as a parameter with which to affect the metallic element composition ratio (Ba+Sr)/Ti.

In this respect, the following ("a" to "e") are the parameters involved in the metallic element composition ratio (Ba+Sr)/Ti of the deposited thin film when the flow rates of Ba source material and Sr source material are constant:

a: the kind and coating percentage of the material coating the substrate surface;

b: the thickness of the coating material;

c: the thickness of the substrate;

d: the heater temperature setting for heating the substrate; and e: the flow rate of Ti source material.

In a first step according to the invention, a thin film which is a sample film is deposited on a sample substrate by varying the parameters "a" to "e", and a composition ratio (Ba+Sr)/Ti of the metallic elements is measured to accumulate data. In this step, the deposition of thin film is carried out establishing that flow rates of Ba source material are constant. The accumulated data are preferably made into a table.

In the second step, before actually forming a BST film, a target composition ratio (Ba+Sr)/Ti of the metallic elements is decided. The parameters "a" to "c" are measured for the sample substrate on which the sample film was formed, and value of the parameter "d" is decided. Then, a flow rate of Ti source material (i.e., the "modified Ti source material flow rate") is obtained by calculating, on the basis of the target value of the composition ratio of the metallic elements and the parameters "a" to "d". This calculation may be performed easily by utilizing the table.

In the third step, the BST film of the target metallic composition ratio (i.e., a "target film") may be formed on the desired substrate (i.e., a "target substrate") by performing the film formation on the basis of the adjusted Ti source material flow rate obtained in this manner, and the flow rates of Ba source material and Sr source material established in the first step. That is, the target film is formed on the target substrate.

In the above method, even if there is a difference in the kind and coating percentage of the material coating the silicon substrate surface, a BST film of the same metallic element composition ratio may be formed. As a result, the dependency on the substrate surface may be eliminated.

Figure 24:
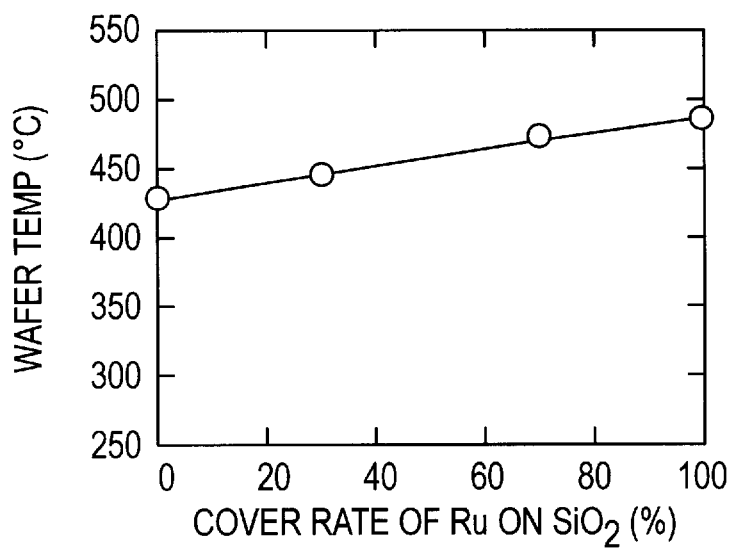
FIG. 24 is a diagram showing a relation between coating rate of substrate surface material and substrate surface temperature in an example in accordance with the invention.

FIG. 24 shows a relation between coating percentage of a wafer surface coated with Ru by patterning on $SiO_2$ at a heater set temperature of 510° C., for example, and temperature of the wafer surface. It is to be understood from FIG. 24 that the greater the coating percentage, the higher the wafer surface temperature in proportion to the coating percentage. Accordingly, it is possible to vary the wafer surface temperature by varying the coating percentage on the basis of data obtained by preliminary measurement (i.e., data obtained by measuring repeatedly the data shown in FIG. 23 by changing the coating percentage and heater temperature setting). The deposition rate of Ti oxide due to the variation in the wafer surface temperature may be obtained from FIG. 25.

Figure 25:
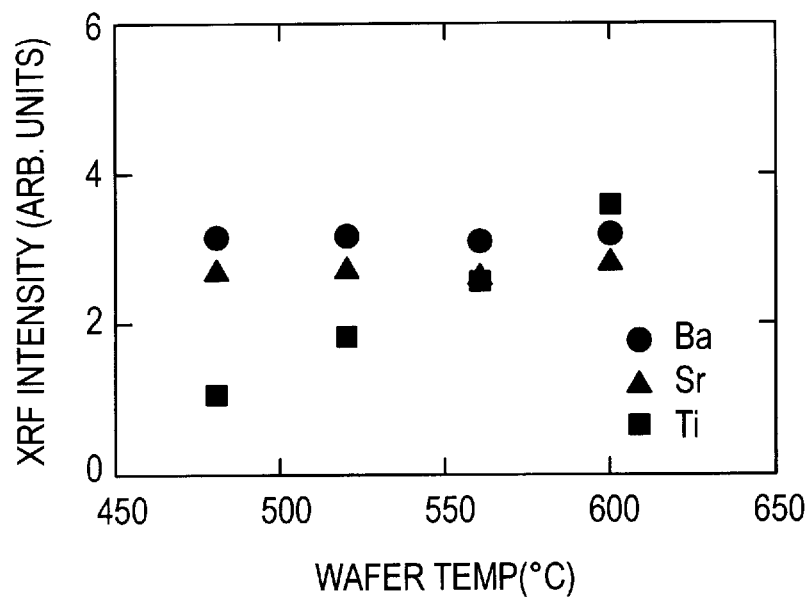
FIG. 25 is a diagram showing a X-ray fluorescence spectroscopy strength of Ba, Sr and Ti of a BST film formed by varying wafer surface temperature.

FIG. 25 is a diagram showing a relation between the wafer surface temperature and the deposition rate of Ti oxide, Ba oxide and Sr oxide. The deposition rate shown in the drawing may be associated with the composition ratio (Ba+Sr)/Ti of the metallic elements in the BST film.

There is a difference between FIG. 5 and FIG. 25 in the respect that while FIG. 5 showing a deposition rate on a silicon substrate, FIG. 25 shows a deposition rate on a wafer on the entire surface of which $SiO_2$ of 5000 Å is formed and Ru film of 2000 Å is further formed thereon. The source material flow rate in FIG. 25 is the same as that shown in Table 1.

It is to be understood from FIG. 25 that, even if the wafer surface temperature varies, the deposition rate of Ba oxide and Sr oxide are hardly affected thereby. That is, the deposition rate varies depending upon the flow rate of Ba source material and Sr source material, but is not affected by wafer surface temperature.

Figure 26:
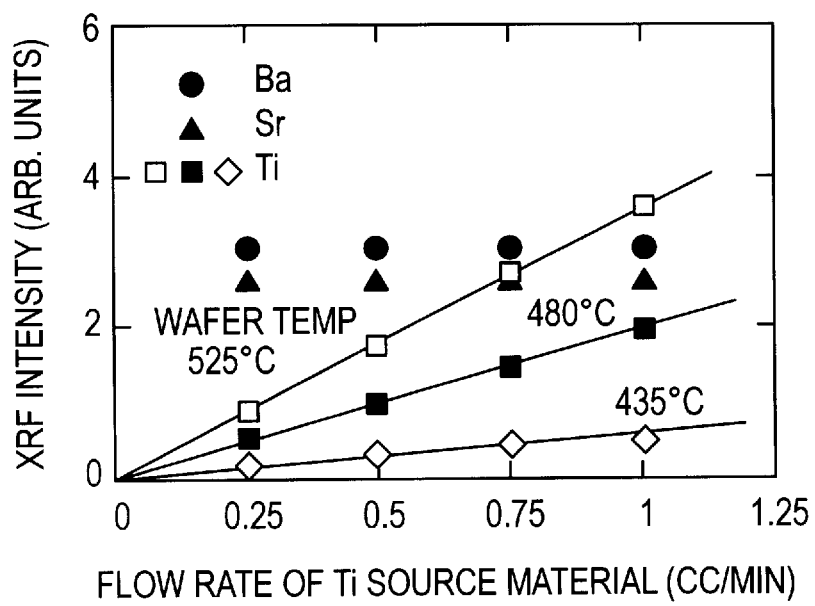
FIG. 26 is a diagram showing a X-ray fluorescence spectroscopy strength of Ba, Sr and Ti of a BST film formed by changing the wafer surface temperature and the Ti source material flow rate.

FIG. 26 is a diagram showing a relation between the Ti source material flow rate, the wafer surface temperature, and the deposition rate of metal oxide. The flow rate of Ti source material necessary for eliminating the influence caused by a variation in wafer surface temperature on the composition ratio (Ba+Sr)/Ti of the metallic elements is obtained from this diagram. Both flow rates of Ba source material and Sr source material are same as those shown in Table 1.

For example, it is supposed herein that a target composition ratio (Ba+Sr)/Ti of the metallic elements is obtained on condition that Ru coating percentage is 100%, wafer surface temperature is 525° C. and Ti source material flow rate is 0.5 cc/min. Then, supposing that surface temperature of the wafer of which 10% is coated with Ru (the remaining 90% is coated with $SiO_2$) is raised to 480° C., the deposition rate of Ti oxide is reduced almost to a half on the mentioned condition that Ti source material flow rate is 0.5 cc/min, resulting in a large variation in the composition ratio (Ba+Sr)/Ti. To cope with this, the Ti source material flow rate is increased to 1 cc/min, whereby it becomes possible to keep the deposition rate of Ti oxide constant and to keep also the composition ratio (Ba+Sr)/Ti constant.

In the foregoing process, although the variation in wafer surface due to variation in the parameters "a" to "dd" is described as first step, and the elimination of influence due to the wafer surface temperature by changing the flow rate of Ti source material is described as second step, it is also possible to understand this as one step in the following manner. On condition that flow rates of Ba source material and Sr source material are constant, parameters affecting the composition ratio (Ba+Sr)/Ti of the metallic elements of BST film are the mentioned "a" to "e".

Although the composition ratio (Ba+Sr)/Ti is affected, or influenced, by the variation in the parameters "a" to "d", the influence due to the variation in the parameters "a" to "d" may be eliminated by adjusting the flow rate of Ti source material, which is the remaining parameter, "e," whereby the composition ratio (Ba+Sr)/Ti may be kept constant.

In the one-step approach mentioned above, the measurement of the wafer surface temperature may be omitted. It is similarly preferable to carry out the measurement of wafer surface temperature in order to control the flow rate of the Ti source material on the basis of the resulting temperature measurement, as a matter of course.

To keep constant the composition ratio of the metallic elements of the BST film, in the thickness direction, the flow rates of Ba source material and Sr source material may be varied stepwise, while keeping the flow rate of Ti source material constant, as shown FIGS. 10 and 12.

To keep constant the composition ratio of the metallic elements, in the thickness direction, and to keep constant the composition ratio (Ba+Sr)/Ti of the metallic elements of the BST film irrespective of variations in the kind and coating percentage of the material coating the wafer surface, the flow rate of Ti raw material, as shown in FIGS. 10 and 12, may be shifted. The shift volume of the Ti raw material flow rate is a volume sufficient to eliminate the influence given to the composition ratio (Ba+Sr)/Ti due to the variation in kind and coating percentage of the material coating the wafer surface, and the shift volume may be obtained per FIG. 26.

Peak values in FIGS. 25 and 26 are obtained if Ba source material flow rate is constant at 0.04 cc/min and Sr source material flow rate is constant at 0.03 cc/min, in the same manner as in Table 1.

It is also possible to obtain peak values by varying the constant flow rates of Ba source material and Sr source material. Here, the above-mentioned steps 1 to 3 may be carried out on the basis of the varied flow rates of Ba source material and Sr source material.

Because the deposition rate of Ba oxide and Sr oxide is in proportion to the flow rate of the source materials irrespective of wafer surface temperature, the deposition rate of Ba oxide and Sr oxide in FIGS. 25 and 26 shifts vertically in proportion to the flow rates of the Ba source material and Sr source material.

As described above, by varying the flow rate of Ti source material, it is possible to obtain a BST film of almost the same film composition as a wafer coated entirely with Pt or Ru even if $SiO_2$ is exposed to the substrate due to the patterning of the Pt or the Ru. In this manner, the dependency on the substrate may be eliminated.

EXAMPLE 9

Figure 27:
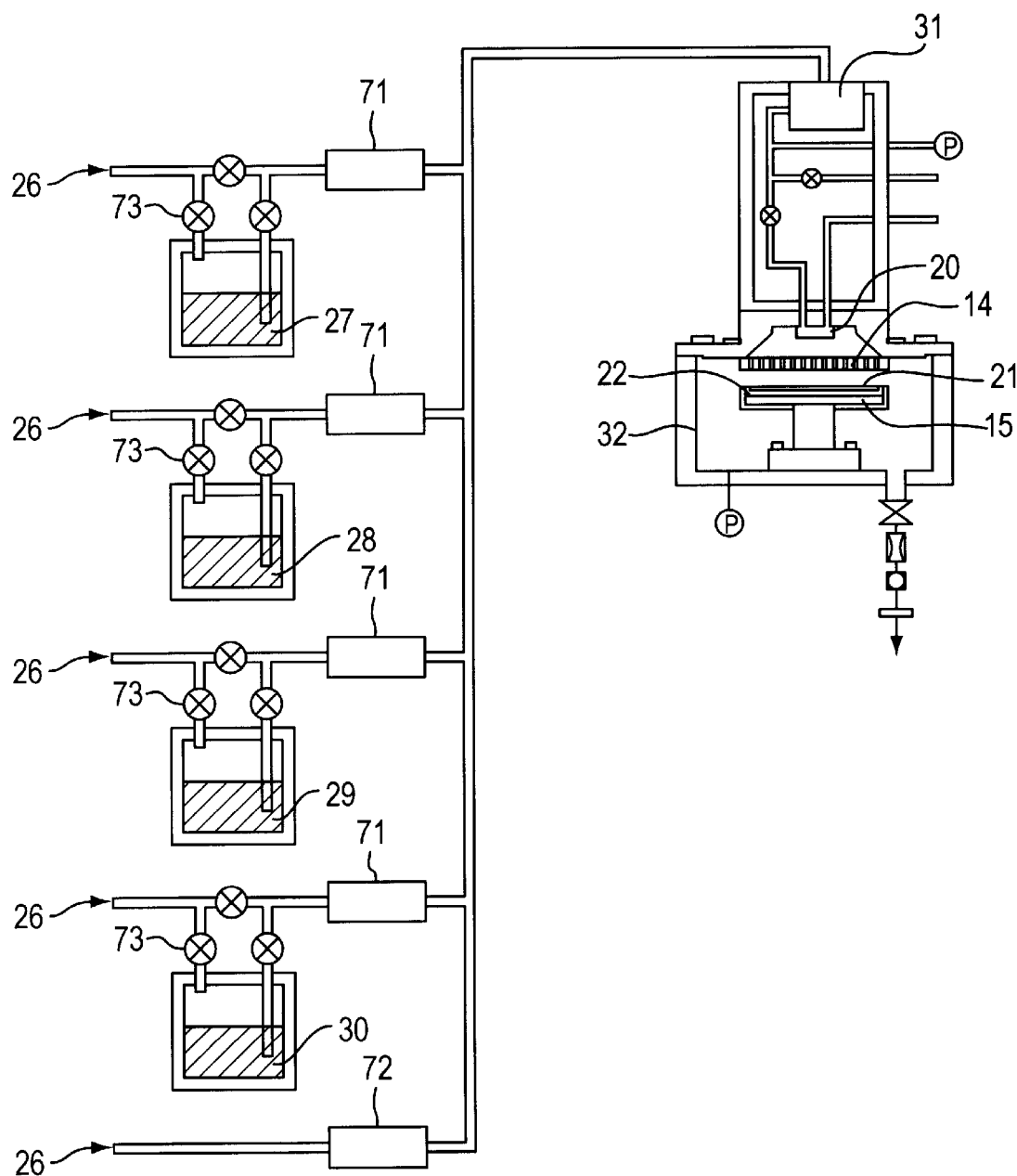
FIG. 27 is a schematic view showing an example of a thin film manufacturing apparatus used in an example in accordance with the invention.

FIG. 27 is a schematic view showing an example of the high dielectric constant thin film forming method in accordance with the invention. In FIG. 27, reference numeral 26 designates $N_2$ gas, numeral 27 designates a $Ba(DPM)_2$/THF mixed solution, 28 designates a $Sr(DPM)_2$/THF mixed solution, 29 is a $TiO(DPM)_2$/THF mixed solution, 30 is a THF, 31 is a vaporizer, 32 is a reaction chamber, 71 is a solution flow rate controller, 72 is a gas flow rate controller. 73 is a pressure valve, 20 is a mixer, and 22 is a susceptor.

To vaporize the source material solutions smoothly by the vaporizer, it is necessary to spray them together with a carrier gas $N_2$. However, when the source material solutions touch $N_2$, the solvent is vaporized and volatilized, and there is a possibility of the solidification of the solid source materials, which could clog the pipe. To overcome this problem, in the invention there is no part where any source material solution touches $N_2$ directly and, therefore, it is possible to introduce first the solvent THF into a line, then the source material solutions 27, 28, and 29 one after another, whereby a gas-liquid mixture is smoothly and constantly supplied to the vaporizer without clogging. With flow rates of the Ba, Sr, and Ti source material solutions set as shown in Table 1, it is estimated that amount of THF first introduced is preferably ⅕ as much as the total flow rate of the Ba, Sr, and Ti source material solutions; in this sense, the solvent was introduced at 0.2 cc/min. Pressure inside the vaporizer is more stable when a larger amount of $N_2$ is supplied, but the flow rate of the solution source material may vary when the amount of $N_2$ supplied is excessively large, and therefore amount of $N_2$ was set to 200 sccm. There is no particular introduction order to be established among the Ba, Sr and Ti source material solutions.

The $N_2$ gas 26 is used just for pressurizing the source material solutions 27, 28, and 29 with respect to the THF 30, and drawing them from the container. The flow rates of the $Ba(DPM)_2$/THF solution, $Sr(DPM)_2$/THF solution, TiO$(DPM)_2$/THF solution, and the THF solution are controlled by the solution flow rate controller 71.

The thin film manufacturing apparatus in FIG. 27 may be used in other situations, in which case the THF 30 is not always required.

EXAMPLE 10

Figure 28:
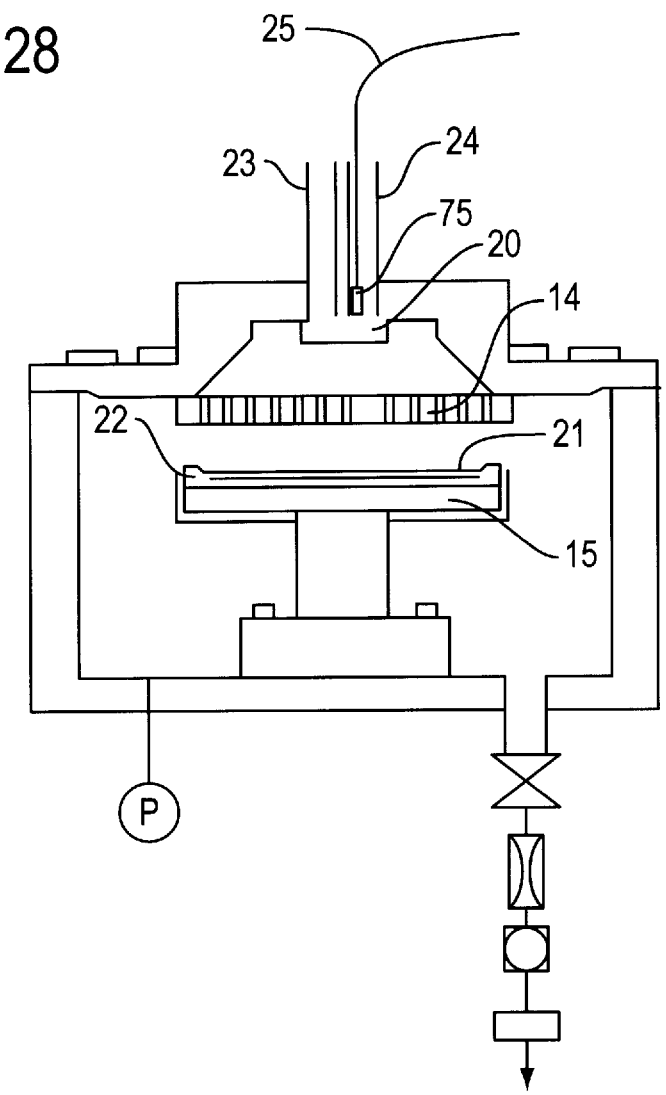
FIG. 28 is a schematic view showing an example of a thin film manufacturing apparatus used in an example in accordance with the invention.

FIG. 28 is a schematic view showing an example of the high dielectric constant thin film forming apparatus in accordance with the invention. In FIG. 28, reference numeral 20 designates a mixer, numeral 21 designates a substrate, 22 is a susceptor, 23 is a source material gas feed pipe, 24 is a $O_2$ gas feed pipe, and 25 is an optical fiber for monitoring temperature. An infrared sensor 75 for detecting a surface temperature of the substrate 21 is provided on the end of the optical fiber 25. A portion detected by the optical sensor is made of $SiO_2$ in every wafer. Since the infrared sensor 75 is disposed in the $O_2$ pipe, even the DPM source material, which easily condenses on the low temperature portion, may stably be monitored without condensation forming on the end of the sensor.

Thus, it becomes possible to monitor the wafer surface temperature by the infrared sensor 75 through the optical fiber, obtain an identical BST film composition by varying the Ti source material flow rate, and eliminate the dependency on substrate, whatever material may be used in any part other than the detected part of wafer, no matter how the patterning may be, and even if the surface area of $SiO_2$ occupied by Pt or Ru is different.

Control of the Ti source material flow rate may be achieved by the conventional manner. That is, the control is performed with the usual feedback control, monitoring the wafer surface temperature by the infrared sensor 75.

In case variation in the wafer surface temperature occurs due to deterioration or the like of the heater or susceptor, such a variation may immediately be detected, and stability or consistency in the film formation may be improved by changing or replacing the deteriorated heater or susceptor.

EXAMPLE 11

Figure 29:
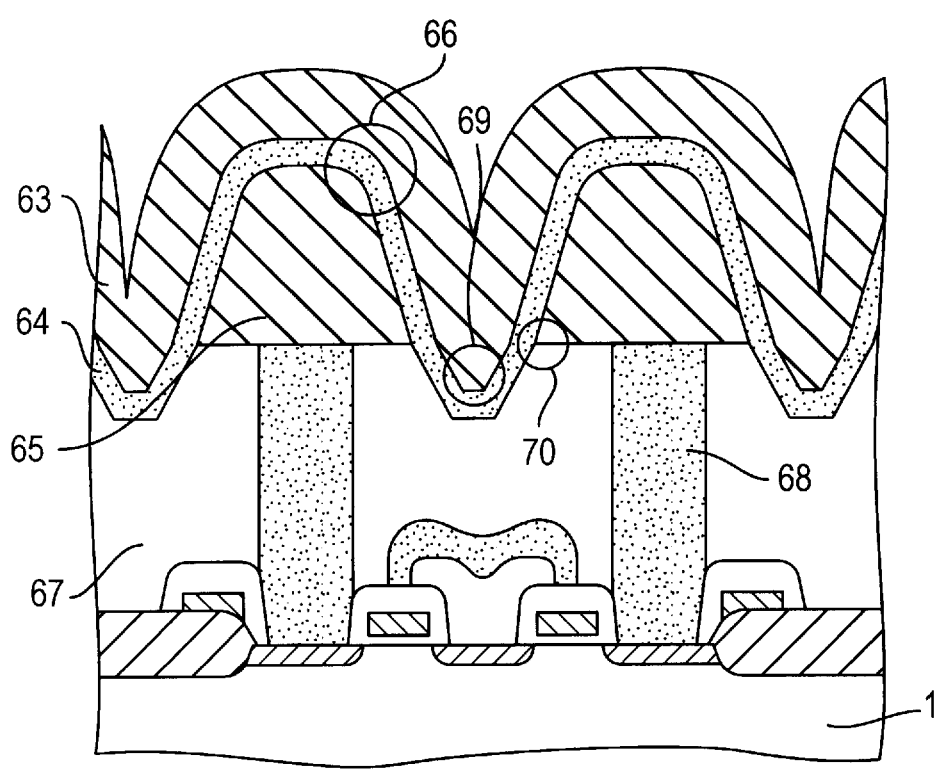
FIG. 29 is a sectional view showing a structure of the high dielectric constant thin film prepared in an example in accordance with the invention.

FIG. 29 is a schematic sectional view showing a capacitor structure of a high dielectric constant thin film as a further example in accordance with the invention. In the drawing, reference numeral 63 designates an upper electrode (cell plate) made of Ru and deposited by a CVD method having a superior coverage characteristic; 64 designates a high dielectric constant thin film, such as BST film, formed by a CVD method for example, 65 designates a lower electrode (storage node) made of Ru deposited, for example, by sputtering. A shoulder portion 66 is rounded with a radius of curvature of 50 nm, and the side faces of the storage node are not vertical (i.e., not 90°), but are inclined instead at 80° with respect to the substrate planar surface. Numeral 67 designates an interlayer insulating film made of silicon dioxide ($SiO_2$), for example, and 68 designates a plug made of polysilicon film (PolySi) deposited by a CVD method having a superior coverage characteristic, for electrically connecting the storage node 35 and a gate transistor. A transistor is formed on the silicon substrate 1 between plugs 68.

A process for manufacturing the capacitor structure shown as an example in accordance with the invention is now described with reference to FIGS. 30(*a*) to (*e*). The polysilicon (PolySi) is buried by a CVD method having a superior coverage characteristic in a contact hole formed by lithography and etching on the interlayer insulating film 67 of silicon dioxide. Then, the portion deposited on the surface of the interlayer insulating film 67 is entirely removed by etching or chemical-mechanical polishing (CMP method), thus forming plug 68 (FIG. 30(*a*)).

Figure 30:
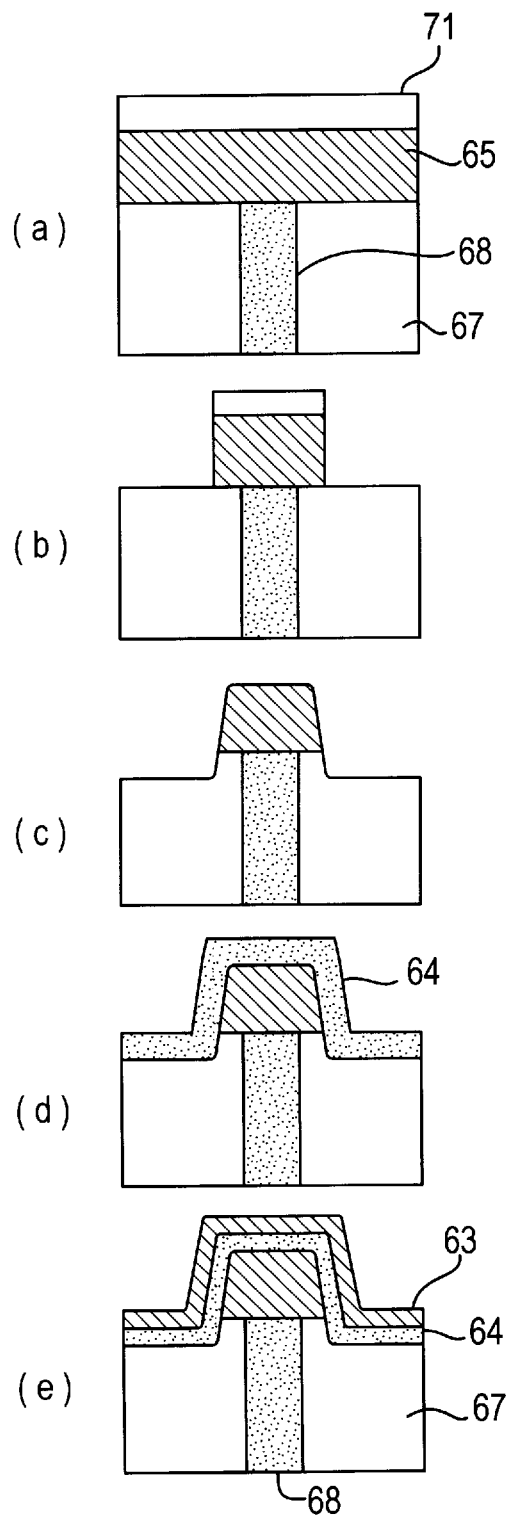
FIGS. 30 (a), (b), (c), (d) and (e) are schematic views showing a manufacturing process of the structure of the high dielectric constant thin film shown in FIGS. 25 and 26.

Then, Ru film 65 of 2000 Å in thickness is deposited on plug 68 by sputtering, and is plasma-etched under an atmosphere of oxygen/chlorine mixed gas up to reaching the underlying interlayer insulating film 67 using a 100 nm silicon oxide ($SiO_2$) film 71 as a mask (FIG. 30(*b*)). Employed in this etching is magnetron RIE (reactive ion etching to which magnetic field is added), and of which etching conditions are established to be $Cl_2/(O_2+Cl_2)=7.5\%$, 300 sccm in total gas amount, 30 mTorr in reaction chamber pressure, 250 W in rf input, and 200 Gauss in magnetic intensity. Under these conditions, the etching rate is 400 Å/min, and when stopping the etching after overetching the underlying interlayer insulating film for 30 sec, the side face inclination of the storage node becomes 80°. This inclination is controllable by varying the total gas amount.

Then, the shoulder portion 66 of the storage node is rounded by plasma sputter-etching under an atmosphere of inert gas, such as Ar, using the same etching apparatus (FIG. 30(*c*)). The sputter-etching rate is 200 Å/min when the Ar amount is 100 sccm, the reaction chamber pressure is 5 mTorr, and the plasma input is 600 W, for example, and in case of processing for 30 sec, the radius of curvature of the shoulder portion 66 of the storage node is 50 nm, which is almost the same as the BST film thickness. This radius of curvature is controllable by varying the processing time.

The entire surface of the storage node 35 of 200 nm in height, formed as mentioned above, is then coated with the BST film 64 of 30 nm in thickness by a CVD method (FIG. 30(*d*)), and the cell plate 33 is further formed by depositing Ru by a CVD method having a superior coverage characteristic (FIG. 30(*e*)).

The BST film 64 is prepared by the thin film forming method according to the invention as mentioned in examples 1 to 9.

The interlayer insulating film 67 of silicon dioxide is provided with a groove. The side face of the storage node is inclined at 80°. Further, the high dielectric constant thin film BST 64 and the cell plate of Ru 63 are deposited on the groove portion by a CVD method having a superior coverage characteristic, whereby it is possible to bury the cell plate 63 more deeply than the lower end of the side face of the storage node.

Figure 31:
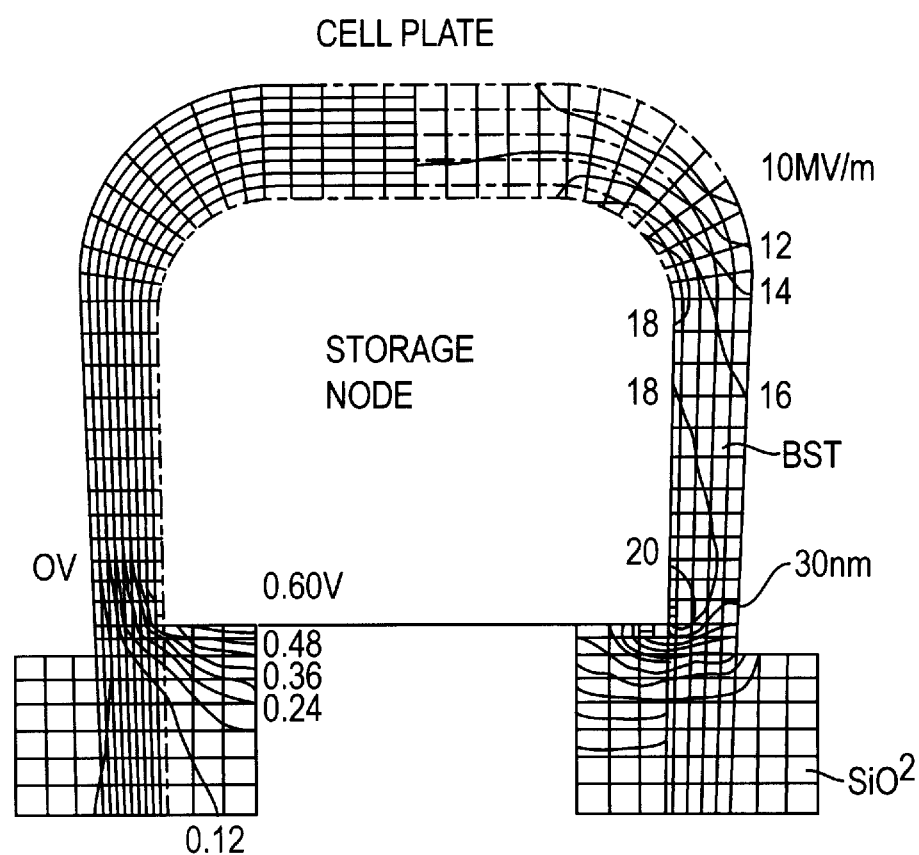
FIG. 31 is a diagram showing three-dimensional electric field strength simulation result in the high dielectric constant thin film formed in an example in accordance with the invention.
Figure 32:
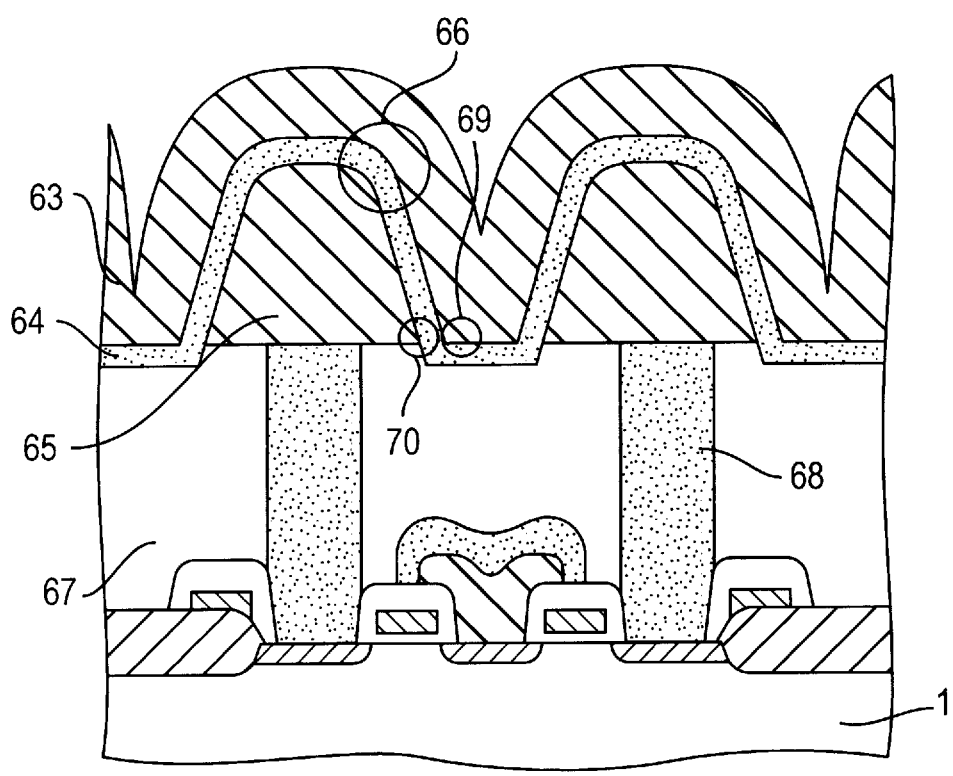
FIG. 32 is a diagram showing electric characteristic of the high dielectric constant thin film formed in an example in accordance with the invention.

In the capacitor formed as described above, when applying a voltage between the cell plate 63 and the storage node 65, since the radius of curvature of the shoulder portion of the storage node is 50 nm, which is larger than the BST film thickness of 30 nm, a field concentration is prevented as can be understood from FIG. 31 which shows a simulation result of three-dimensional electric field strength. Consequently, the increase in leakage current may be restrained as shown in FIG. 32. This is because, with the enlarged radius of curvature of the shoulder portion 66, the adhesive property of the BST film is improved.

The field concentration on the lower end of the cell plate may be also prevented by burying the cell plate 63 more deeply than the lower end of the side face of the storage node 65. Further, as a result of burying the cell plate 63 more deeply than the lower end of the side face of the storage node 65, the entire side face of the storage node 65 may be effectively utilized as a capacitor electrode, thereby increasing the electric capacity. Furthermore, there is an advantage of solving the problem that potentials of the storage nodes adjacent each other interfere or affect negatively with each other through the BST film in the cut portion.

The groove of the interlayer insulating film is provided so as to form its side face with an inclination of 60°. Under an atmosphere of inert gas such as Ar and HF mixed gas, the groove of the interlayer insulating film 67 of silicon dioxide is formed by plasma simultaneously with the removal of the oxidation mask. At this time, it is possible to control the inclination of the side face of the groove in the interlayer insulating film by optimizing the pressure in the reaction chamber, mixing ratio of Ar and HF, and plasma input. In this example, the inclination of the groove side face is 60°, which is smaller than the 80° inclination of the storage node side face. The field concentration on the lower end of the side face of the storage node is moderated by forming the inclination of side face of the groove of interlayer insulating film 67 to be 60°, which is smaller than 80° inclination of the storage node side face.

EXAMPLE 12

Figure 33:
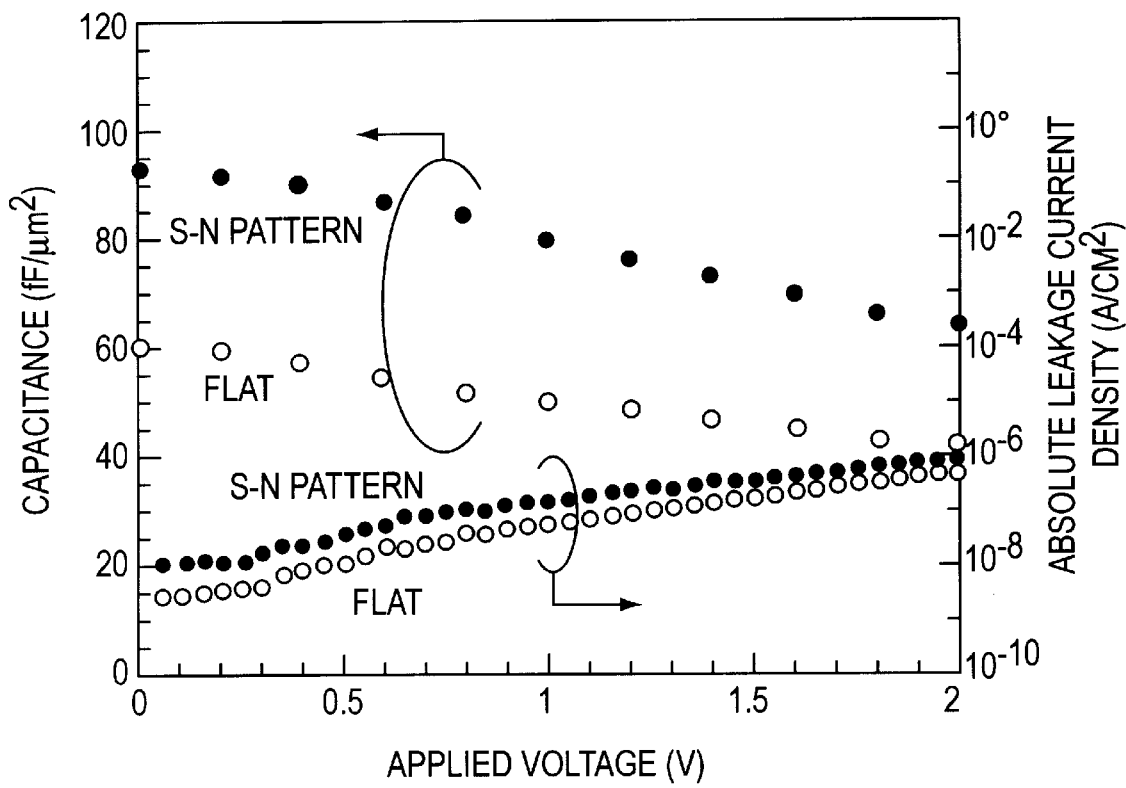
FIG. 33 is a sectional view showing a structure of the high dielectric constant thin film formed in an example in accordance with the invention.

FIG. 33 is a schematic sectional view of a capacitor structure shown as a further example of the high dielectric constant film in accordance with the invention. In this example, the cell plate 63 is buried with the same depth as the lower end of the side face of the storage node and, accordingly, field concentration is simultaneously moderated on both the lower end 69 of the cell plate and on the lower end 70 of the side face of the storage node, thereby increase in leakage current being restrained. The BST film 64 may be prepared by the thin film forming method mentioned in examples 1 to 9.

Although BST is described as a material of high dielectric constant capacitor in this example, the same advantage may be achieved by other high dielectric constant material such as PZT as a matter of course.

What is claimed is:

1. A method for forming a dielectric film by CVD, said method comprising the steps of:
   providing two or more organometallic compounds;
   depositing, by CVD, metal oxide on a substrate concurrently using said two or more organometallic compounds as source materials for corresponding metallic elements to be deposited in said dielectric film; and
   varying a surface temperature of said substrate, during said deposition step, to change a composition ratio, in the film thickness direction, of said metallic elements in said dielectric film;
   wherein said deposition of said metal oxide is by decomposition of at least one of said organometallic compounds, and said decomposition of said at least one of said organometallic compounds depends on said surface temperature of said substrate.

2. A method for forming a dielectric film, said method comprising:
   providing two or more organometallic compounds;
   depositing, by CVD, metal oxide on a substrate using said two or more organometallic compounds as source materials for corresponding metallic elements to be deposited in said dielectric film; and
   varying a surface temperature of said substrate, during said deposition step, to change a composition ratio, in the film thickness direction, of said metallic elements in said thin film;
   wherein said deposition of said metal oxide is by decomposition of at least one of said organometallic compounds, and said decomposition of said at least one of said organometallic compounds depends on said surface temperature of said substrate;
   wherein said organometallic compounds comprise a Ba dipivaloylmethanato compound, a Sr dipivaloylmethanato compound, and a Ti dipivaloylmethanato compound;
   wherein said at least one of said organometallic compounds is said Ti dipivaloylmethanato compound; and
   wherein said deposition of said metal oxide by said decomposition of said Ti dipivaloylmethanato compound depends on said surface temperature of said substrate.

3. A method for forming a barium strontium titanate (Ba, Sr) $TiO_3$ film (BST film), comprising:
   (a) obtaining accumulated data with respect to a plurality of sample film operations, including:
       (a-1) determining a constant Ba flow rate for Ba source material and a constant Sr flow rate for Sr source material;
       (a-2) performing a sample film operation, including:
           (a-2-i) providing a sample with a sample substrate comprising a sample substrate material having a sample substrate thickness,
           (a-2-ii) providing said sample with a sample coating material at a sample coating material thickness, said sample coating material coating a respective percentage of said sample substrate,
           (a-2-iii) selecting a heating temperature,
           (a-2-iv) selecting a Ti flow rate for Ti source material,
           (a-2-v) depositing a sample BST film on said sample using said selected heating temperature, said selected Ti flow rate, said constant Ba flow rate, and said constant Sr flow rate,
           (a-2-vi) measuring a sample composition ratio of Ti, Ba, and Sr in said sample BST film, and
           (a-2-vii) recording, as said accumulated data, a sample parameter set including respective sample values for: said sample coating material, said percentage of said sample substrate coated by said sample coating material, said sample coating material thickness, said sample substrate thickness, said selected heating temperature, said selected Ti flow rate, and said sample composition ratio;
       (a-3) performing said sample film operation a plurality of times, including varying at least one of: said sample coating material, said percentage of said sample substrate coated by said sample coating material, said sample coating material thickness, said sample substrate thickness, said selected heating temperature, and said selected Ti flow rate;

(b) providing and measuring a target to be coated, including:

(b-1) providing a target substrate comprising a target substrate material having a target substrate thickness, (b-2) providing on said target a target coating material at a target coating material thickness, said target coating material coating a respective percentage of said target substrate, (b-3) selecting a target composition ratio of Ti, Ba, and Sr for a target BST film, (b-4) measuring said target substrate thickness, said target coating material thickness, and said respective percentage of said target substrate coated by said target coating material, and (b-5) selecting a target heating temperature;

(c) using said accumulated data to determine a target Ti flow rate based on one of said plurality of sample film operations having said sample parameter set with said respective sample values substantially similar to values for said target coating material, said percentage of said target substrate coated by said target coating material, said target coating material thickness, said target substrate thickness, said selected target heating temperature, and said target composition ratio; and (d) forming said target BST film on said target using said selected target heating temperature, said determined target Ti flow rate, said constant Ba flow rate, and said constant Sr flow rate.

* * * * *